United States Patent
Komoriya et al.

(10) Patent No.: US 9,678,425 B2
(45) Date of Patent: *Jun. 13, 2017

(54) POLYMERIZABLE FLUOROMONOMER, FLUOROPOLYMER, RESIST MATERIAL, AND METHOD OF PATTERN FORMATION

(71) Applicant: Central Glass Company, Limited, Ubi-shi, Yamaguchi (JP)

(72) Inventors: Haruhiko Komoriya, Saitama (JP); Shinichi Sumida, Kawagoe (JP); Kenjin Inomiya, Fujimino (JP); Takashi Mori, Fujimino (JP); Takamasa Kitamoto, Asaka (JP); Yusuke Kanto, Fujimino (JP)

(73) Assignee: Central Glass Company, Limited, Ube-shi (JP)

( * ) Notice: Subject to any disclaimer, the term of this patent is extended or adjusted under 35 U.S.C. 154(b) by 362 days.

This patent is subject to a terminal disclaimer.

(21) Appl. No.: 14/246,561

(22) Filed: Apr. 7, 2014

(65) Prior Publication Data

US 2014/0220490 A1 Aug. 7, 2014

Related U.S. Application Data

(62) Division of application No. 13/139,665, filed as application No. PCT/JP2009/070319 on Dec. 3, 2009, now Pat. No. 8,716,385.

(30) Foreign Application Priority Data

Dec. 15, 2008 (JP) .................. 2008-319027

(51) Int. Cl.
| | | |
|---|---|---|
| G03F 7/004 | (2006.01) |
| C09D 133/16 | (2006.01) |
| G03F 7/038 | (2006.01) |
| C08F 20/28 | (2006.01) |
| C08F 220/24 | (2006.01) |
| G03F 7/039 | (2006.01) |
| G03F 7/20 | (2006.01) |
| C08F 220/18 | (2006.01) |
| C08F 220/28 | (2006.01) |

(52) U.S. Cl.
CPC ............ *G03F 7/038* (2013.01); *C08F 20/28* (2013.01); *C08F 220/24* (2013.01); *G03F 7/004* (2013.01); *G03F 7/0046* (2013.01); *G03F 7/0397* (2013.01); *G03F 7/2041* (2013.01); *C08F 220/18* (2013.01); *C08F 220/28* (2013.01); *Y10T 428/24479* (2015.01)

(58) Field of Classification Search
USPC ................. 526/245, 242; 524/379
See application file for complete search history.

(56) References Cited

U.S. PATENT DOCUMENTS

| | | | | |
|---|---|---|---|---|
| 6,136,499 A * | 10/2000 | Goodall | ................ | C08G 61/08 430/270.1 |
| 7,402,626 B2 | 7/2008 | Maeda et al. | | |
| 8,053,161 B2 * | 11/2011 | Wada | .................... | G03F 7/0046 430/270.1 |
| 8,592,508 B2 * | 11/2013 | Komoriya | ............. | C08F 220/24 524/379 |
| 8,716,385 B2 * | 5/2014 | Komoriya | ............... | C08F 20/28 524/379 |
| 2002/0009668 A1 | 1/2002 | Nishimura et al. | | |

(Continued)

FOREIGN PATENT DOCUMENTS

| | | |
|---|---|---|
| JP | 9-73173 A | 3/1997 |
| JP | 9-230595 A | 9/1997 |

(Continued)

OTHER PUBLICATIONS

Corresponding International Search Report (Form PCT/ISA/210) dated Jan. 12, 2010 with English Translation including Form PCT/ISA/237 (Eight (8) pages).
T.I. Kalendareva et al., "Synthesis of 3-Hydroxy-4-(α-hydroxyhexafluoroisopropyl) Phenyl Methacrylate, Its Homopolymer, and Its Copolymer with N-Vinylpyrrolidone.", Uzbekskii Khimicheskii Zhurnal, 1990, No. 5, pp. 43-46.

(Continued)

*Primary Examiner* — Mark Kaucher
*Assistant Examiner* — Henry Hu
(74) *Attorney, Agent, or Firm* — Crowell & Moring LLP

(57) ABSTRACT

Disclosed is a polymerizable fluoromonomer represented by the following general formula (1). In the formula, $R^1$ represents a hydrogen atom, methyl group, fluorine atom, or trifluoromethyl group. n is an integer of 0 or 1, and m is that of from 1 to (3+n). $R^2$ and $R^3$ each independently represents a hydrogen atom or a protective group. A resist containing a fluoropolymer obtained by polymerizing or copolymerizing the monomer is suitable for use in microfabrication by immersion exposure or by a double patterning process based on immersion exposure.

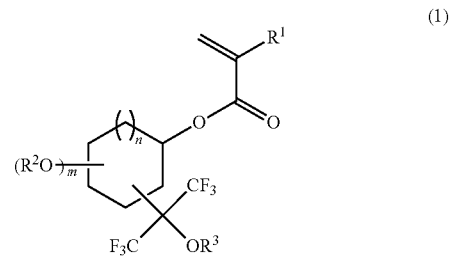

3 Claims, No Drawings

(56) References Cited

U.S. PATENT DOCUMENTS

| | | |
|---|---|---|
| 2004/0106755 A1 | 6/2004 | Sumida et al. |
| 2005/0124827 A1 | 6/2005 | Breyta et al. |
| 2005/0227174 A1 | 10/2005 | Hatakeyama et al. |
| 2005/0250898 A1 | 11/2005 | Maeda et al. |
| 2007/0003867 A1 | 1/2007 | Hatakeyama et al. |
| 2007/0178405 A1 | 8/2007 | Kanda et al. |
| 2007/0179309 A1 | 8/2007 | Hasegawa et al. |
| 2008/0003517 A1 | 1/2008 | Komoriya et al. |
| 2008/0206668 A1 | 8/2008 | Hoshino et al. |
| 2008/0305433 A1 | 12/2008 | Kanda et al. |
| 2008/0311507 A1 | 12/2008 | Isono et al. |
| 2011/0245395 A1* | 10/2011 | Komoriya ............. C08F 220/24 524/379 |

FOREIGN PATENT DOCUMENTS

| | | | |
|---|---|---|---|
| JP | 9-325498 A | | 12/1997 |
| JP | 10-282671 A | | 10/1998 |
| JP | 2002-072484 | * | 3/2002 |
| JP | 2002-72484 A | | 3/2002 |
| JP | 2004-083900 | * | 3/2004 |
| JP | 2004-83900 A | | 3/2004 |
| JP | 2005-197349 A | | 7/2005 |
| JP | 2005-213215 | * | 8/2005 |
| JP | 2005-213215 A | | 8/2005 |
| JP | 2005-232095 A | | 9/2005 |
| JP | 2005-316352 A | | 11/2005 |
| JP | 2005-321765 | * | 11/2005 |
| JP | 2005-321765 A | | 11/2005 |
| JP | 2007-25634 A | | 2/2007 |
| JP | 2007-204385 A | | 8/2007 |
| JP | 2007-304537 A | | 11/2007 |
| JP | 2008-203536 A | | 9/2008 |
| JP | 2008-233877 A | | 10/2008 |
| JP | 2009-19199 A | | 1/2009 |
| TW | 2006-02301 A | | 1/2006 |

OTHER PUBLICATIONS $2^{nd}$ Immersion Work Shop, "Resist and Cover Material Investigation for Immersion Lithography" Jul. 11, 2003.

Basil S. Farah et al., "Phenolic Derivatives of the Perhaloacetones", J. Org. Chem., 1965, 30(4), pp. 1003-1005.

Taiwanese Office Action dated Nov. 12, 2012 (four (4) pages).

* cited by examiner

POLYMERIZABLE FLUOROMONOMER, FLUOROPOLYMER, RESIST MATERIAL, AND METHOD OF PATTERN FORMATION

CROSS REFERENCE TO RELATED APPLICATIONS

This application is a divisional of U.S. application Ser. No. 13/139,665, filed, Jun. 14, 2011, now U.S. Pat. No. 8,716,385, which is a National Stage of PCT International Application PCT/JP2009/070319, filed Dec. 3, 2009, which claims priority from Japanese Patent Application No. 2008-319027, filed on Dec. 15, 2008, the disclosures of which are expressly incorporated by reference herein.

TECHNICAL FIELD

The present invention relates to a fluorine-containing (meth)acrylate compound serving as a novel polymerizable fluoromonomer, a fluoropolymer obtained by polymerizing or copolymerizing the same, a resist material, and a pattern formation method.

BACKGROUND OF THE INVENTION

In recent years, a microprocessor fabrication technique has been remarkably progressing. On highly integrated circuits, transistors of which number exceeds 600 million are formed. Such an explosive advance is achieved by making the minimum line width of electronic circuits finer, so that lithography using an ArF excimer laser (193 nm) is on its way to being introduced seriously. Hitherto ultraviolet rays and laser light (excimer lasers such as argon fluoride, krypton fluoride and the like) have been used therefor, but in the future, studies will be developed toward commercialization of EUV (extreme ultraviolet) with further shorter wavelengths.

In lithography using the ArF excimer laser, processing of design rules of 0.13 μm or less has been adopted; in which novolac resin and polyvinyl phenol, which are hitherto used on a KrF excimer laser light, can not be used as a resin for use in ArF resist because their absorption properties are strongly exhibited at 193 nm. In view of this, aromatic ones are replaced with aliphatic ones in order to improve transparency, and furthermore, acrylic resins and cycloolefin resins into which a cyclic compound is introduced have been developed in order to ensure etching resistance (Patent Publications 1 to 4).

Acrylic resins can be readily produced and monomers therefor that have a variety of chains have been produced, so that acrylic resins are characterized by providing an extremely high degree of flexibility in molecular design. However, acrylic resins mainly contain a carboxyl group as an alkali-soluble group and therefore high in acidity as compared with phenolic hydroxyl group hitherto adopted in conventional KrF resists, so that it has been difficult to fully prevent a pattern disturbance caused by controlling a dissolution rate in an alkali developing solution and by swelling. From such a background, monomers containing fluoroalcohol-based alkali-soluble groups are suggested (Patent Publications 5 to 7). It is reported that resist materials that use macromolecule compounds containing fluoroalcohol-based monomers as a copolymer component are excellent in resolution performance and swelling-preventing effect, and greatly useful in lithography using a short wavelength light source for the purpose of microfabrication.

On the other hand, a stepper (a reduction projection aligner) has been dramatically improved in resolution performance by performance improvements of reduction projector lenses and by refinements of optical designs. The performance of lenses used in the stepper is expressed by NA (numerical aperture), and its value of around 0.9 is defined as a physical limit in air but it has already been attained at the present time. With this, it is now on attempt to raise NA to 1.0 or more by filling a space defined between a lens and a wafer with a medium having a larger refractive index than air, in which an exposure technique adopting an immersion method in particular use of water has received attention.

In lithography using the ArF excimer laser, it has been pointed out that contact between a resist film and water brings about various concerns. Particularly, acid generated in the film by exposure, changes in pattern shape caused when an amine compound added as a quencher dissolves in water, a pattern collapse due to swelling, and the like are concerned. In view of this, there is given a report that a topcoat layer disposed on the resist is effective at separating the resist film by water.

A topcoat plays an important role in improving the throughput (treatment efficiency). More specifically, in order to run an immersion exposure step with a shorter time, it is required not to leave water on the resist and it is required to enhance the water repellency on the surface also in connection with the number of defects. However, in the case of intending to dissolve the topcoat layer together with exposed portions of the resist at the time of development, a highly water-repellent topcoat is not necessarily high in solubility in developing solution. Rather, the water repellency and the solubility in developing solution are conflicting with each other in most cases. At present, how much improvement is made on the water repellency of a topcoat of a developing solution-soluble type is of utmost concern, in which a variety of attempts are being carried out (Patent Publication 8).

Additionally, attempts to form a finer pattern by using ArF immersion lithography have also been conducted eagerly. One of these attempts is a method adopting a double patterning process, some manners of which have been suggested.

For example, Patent Publication 9 can be cited as a known example of a double patterning process that adopts a freezing process in which a first resist pattern is changed in properties and characteristics so as not to dissolve in a second resist solution. In this example, irradiation with vacuum ultraviolet rays is performed after forming the first resist pattern, followed by freezing. In this method, however, it is indicated that a pattern width of the first resist pattern is changed between prior to and subsequent to the vacuum ultraviolet irradiation; as countermeasures against this, a pattern width correction is made on the first resist pattern with consideration of the pattern width changes caused by the vacuum ultraviolet irradiation. However, a variety of widths and shapes occur in actual fabrication of semiconductors, it is not actually possible to so design the corrected mask as to meet them each.

Of fundamental properties required for the freezing process, the important matter is that the first resist pattern does not dissolve in the second resist solution, and the necessary matter is that the pattern width of the first resist pattern does not change. There are disclosed in Patent Publication 10 a surface treating agent for use in a chemical freezing process, and a pattern formation method using it. However, this method requires operations including; impregnation with the treating agent, subsequent to formation of the first resist pattern; then giving rise to a chemical reaction between the grained treating agent and a resin that exists in the resist pattern; removing an excess of the treating agent that remains on a substrate by rinsing; and removing a rinsing liquid grained into the resist pattern. Since the number of steps is so increased as to make the operations exceedingly complicated, this method is not satisfactory from the viewpoint of productivity.

REFERENCES ABOUT PRIOR ART

Patent Publication

Patent Publication 1; Japanese Patent Application Publication No. 9-73173
Patent Publication 2; Japanese Patent Application Publication No. 10-282671
Patent Publication 3: Japanese Patent Application Publication No. 9-230595
Patent Publication 4: Japanese Patent Application Publication No. 9-325498
Patent Publication 5: Japanese Patent Application Publication No. 2002-072484
Patent Publication 6: Japanese Patent Application Publication No. 2004-083900
Patent Publication 7: Japanese Patent Application Publication No. 2007-204385
Patent Publication 8: Japanese Patent Application Publication No. 2005-316352
Patent Publication 9: Japanese Patent Application Publication No. 2005-197349
Patent Publication 10: Japanese Patent Application Publication No. 2008-203536

Non-Patent Publication

Non-Patent Publication 1: 2nd Immersion Work Shop, Jul. 11, 2003, Resist and Cover Material Investigation for Immersion Lithography

SUMMARY OF THE INVENTION

Under the above-mentioned background, the present invention provides a monomer for use in a resist resin allowing a fine pattern formation, and more particularly, a monomer for use in a resist resin suitable for microfabrication conducted in the immersion exposure or in the immersion-employing double patterning process. Additionally, a resist material formed of a resin containing the monomer, and a pattern formation method using it are provided.

The present inventors have eagerly made studies in order to solve the above-mentioned problems. As a result, it is found that a resist resin exhibits a moderate water-repellency before exposure while exhibiting a prompt solubility in a developing solution after exposure, thereby allowing forming an excellent resist pattern, in the case where a monomer having a polymerizable group, an aliphatic structure and a ring to which one hexafluoroisopropyl hydroxyl group and a specified number of hydroxyl groups are bonded is used as a copolymer component of the resist resin (the hexafluoroisopropyl hydroxyl group or the hydroxyl groups bonding to the ring may be partially or entirely protected with a protective group).

Incidentally, the hexafluoroisopropyl hydroxyl group is represented by the following structure and high in fluorine content, and contains a hydroxyl group serving as a polar group. It functions as an acid group and exhibits solubility in an alkali developing solution.

[Chemical Formula 1]

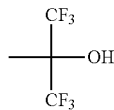

HEXAFLUOROISOPROPYL HYDROXYL GROUP

More specifically, the present invention is a fluorine-containing (meth)acrylate compound serving as a novel polymerizable fluoromonomer, a fluoropolymer obtained by polymerizing or copolymerizing the same, a resist material using the same, and a pattern formation method. The polymerizable fluoromonomer includes a repeating unit having; a polymerizable group; an aliphatic structure, i.e., a 5-membered ring or a 6-membered ring; and a ring to which one hexafluoroisopropyl hydroxyl group and 1 to 4 hydroxyl groups are bonded in the case of the 6-membered ring (the hexafluoroisopropyl hydroxyl group or the hydroxyl groups bonding to the ring may be partially or entirely protected with a protective group) or a ring to which one hexafluoroisopropyl hydroxyl group and 1 to 3 hydroxyl groups are bonded in the case of the 5-membered ring (the hexafluoroisopropyl hydroxyl group or the hydroxyl groups bonding to the ring may be partially or entirely protected with a protective group). In the present specification, "a resist material" refers to a composition obtained by adding a solvent and other component to a so-called base resin having a developing solution-solubility changeable by exposure, and is sometimes referred to as "a resist composition" or merely "a resist". Additionally, in the case of containing a solvent, the resist material is sometimes referred to as "a resist solution".

Additionally, the resist material of the present invention can be used as the second layer in the double patterning process (as discussed below), thereby providing the pattern formation method.

The present invention includes the following [Invention 1] to [Invention 15].

In a first embodiment of the invention is a polymerizable fluoromonomer represented by the following general formula (1).

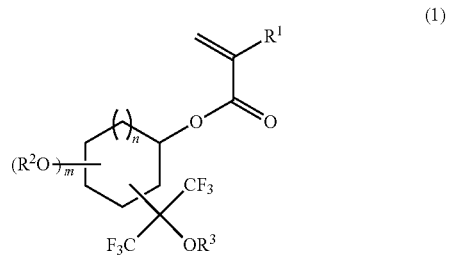

[In the formula, $R^1$ represents a hydrogen atom, methyl group, fluorine atom, or trifluoromethyl group. n is an integer of 0 or 1, and m is that of from 1 to (3+n). $R^2$ and $R^3$ each independently represents a hydrogen atom or a protective group.]

In a second embodiment of the invention, both $R^2$ and $R^3$ are hydrogen atoms in the polymerizable fluoromonomer as discussed in the first embodiment of the invention.

In a third embodiment of the invention, a polymerizable fluoromonomer as discussed in the second embodiment of the invention, the polymerizable fluoromonomer is selected from the group consisting of fluoromonomers represented by the following general formula (2) to the general formula (4).

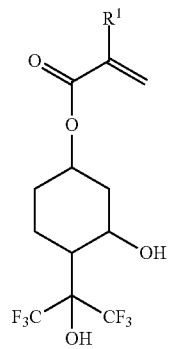
(2)

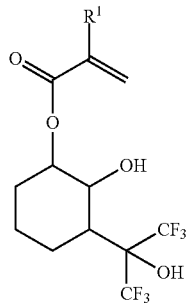
(3)

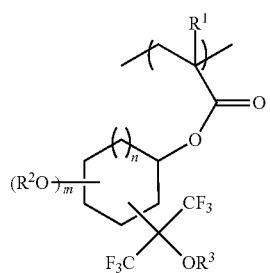
(4)

[In the formula, R¹ represents a hydrogen atom, methyl group, fluorine atom, or trifluoromethyl group.]

In a fourth embodiment of the invention, a fluoropolymer is characterized by containing a repeating unit represented by the following general formula (5).

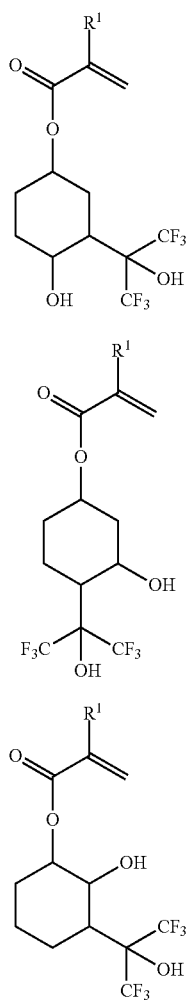
(5)

[In the formula, R¹ represents a hydrogen atom, methyl group, fluorine atom, or trifluoromethyl group. n is an integer of 0 or 1, and m is that of from 1 to (3+n). R² and R³ each independently represents a hydrogen atom or a protective group.]

In a fifth embodiment of the invention, both R² and R³ are hydrogen atoms in the fluoropolymer as discussed in the fourth embodiment of the invention.

In a sixth embodiment of the invention, the fluoropolymer as discussed in the fifth embodiment of the invention has a repeating unit represented by any one of the following general formula (6) to the general formula (8).

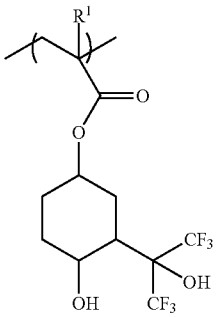
(6)

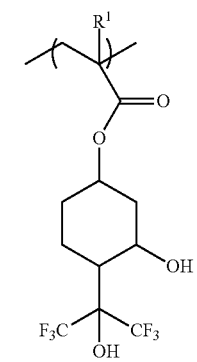
(7)

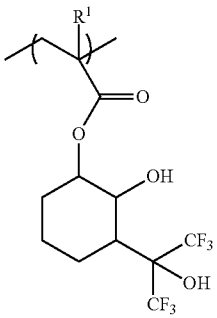
(8)

[In the formula, R¹ represents a hydrogen atom, methyl group, fluorine atom, or trifluoromethyl group.]

In a seventh embodiment of the invention, a fluoropolymer as discussed in embodiment four of the invention, is characterized in that the fluoropolymer further contains a repeating unit having an acid labile group or an adhesive group.

In an eighth embodiment of the invention, a resist material is characterized by containing a fluoropolymer as discussed in embodiment four of the invention.

In a ninth embodiment of the invention, a resist material as discussed in embodiment eight of the invention is characterized by further containing at least one kind of an acid generator, a basic compound and an organic solvent.

In a tenth embodiment of the invention is a resist material as discussed in embodiment nine of the invention, wherein the organic solvent is an alcohol-based solvent having 5 to 20 carbon atoms.

In an eleventh embodiment of the invention, a pattern formation method is characterized by including a step of applying a resist material as discussed in the eighth embodiment of the invention onto a substrate, a step of exposing the resist material to a high-energy ray of a wavelength of 300 nm or less through a photomask after heating treatment, and a step of developing the resist material by using a developing solution after conducting heating treatment as necessary.

In a twelfth embodiment of the invention, a pattern formation method as discussed in embodiment eleven of the invention, is characterized by being an immersion lithography in which an ArF excimer laser of 193 nm in wavelength is used and in which water is inserted between a wafer and a projector lens.

In a thirteenth embodiment of the invention, a pattern formation method as discussed in embodiment twelve of the invention, is characterized by: being a pattern formation method including the step of applying the resist material onto the substrate previously formed with a resist pattern, the step of exposing it with the high-energy ray of the wavelength of 300 nm or less through the photomask after heating treatment, and the step of developing it by using the developing solution after conducting heating treatment as necessary; and using a resist material as discussed in embodiment eight of the invention as the resist material.

In a fourteenth embodiment of the invention, a pattern formation method as discussed in embodiment thirteen of the invention, is characterized in that a solvent for the resist material is an alcohol-based solvent having 5 to 20 carbon atoms.

In a fifteenth embodiment of the invention, a semiconductor device is produced by a pattern formation method as discussed in embodiment eleven of the invention.

DETAILED DESCRIPTION

A resist material containing a fluoropolymer obtained by polymerizing or copolymerizing a polymerizable fluoromonomer, according to the present invention exhibits a moderate water-repellency against water before exposure while exhibiting a prompt solubility in a developing solution after exposure. Therefore, it is possible to form a resoluble pattern excellent in terms of the depth of focus, the mask error factor and the line edge roughness not only in dry exposure but also in immersion exposure. Additionally, the resist material of the present invention can be changed to a solution, by alcohol-based solvents having 5-20 carbon atoms and not able to dissolve typical resist materials, or the like. With this, the resist material can be used for a top resist for use in a double patterning process. Furthermore, the polymerizable fluoromonomer is excellent in polymerization reactivity and can produce the fluoropolymer useful for the resist material at a relatively low cost.

A polymerizable fluoromonomer of the present invention is represented by the following general formula (1).

[Chemical Formula 6]

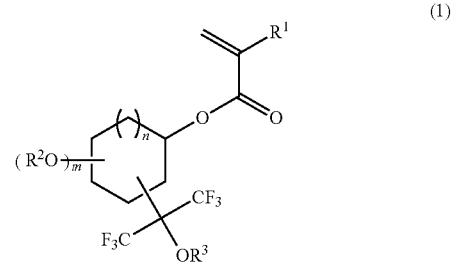

[In the formula, $R^1$ represents a hydrogen atom, methyl group, fluorine atom, or trifluoromethyl group. n is an integer of 0 or 1, and m is that of from 1 to (3+n). $R^2$ and $R^3$ each independently represents a hydrogen atom or a protective group.] The general formula (1) represents a 5-membered ring with n=0, while representing a 6-membered ring with n=1. The present invention may take either the 5-membered ring or the 6-membered ring, but preferably takes the 6-membered ring because of its availability, cost and easiness to synthesize.

Additionally, m, the number of a substituent $(R^2O)-$, is represented by 1 to (3+n). It is 1 to 3 in the case of the 5-membered ring, while it is 1 to 4 in the case of the 6-membered ring.

A compound represented by the general formula (1) may include a structure in which two substituents other than hydrogen atom are concurrently bonded to each carbon atom constituting the alicyclic structure. However, in the case where the substituents are bonded to the carbon atom, a structure where one substituent and one hydrogen atom are bonded to the carbon atom is preferable because such a structure is readily available. Therefore, a fluoromonomer having a structure where at least one hydrogen atom is bonded to every carbon atom constituting the alicyclic structure is preferably adopted as the compound represented by the general formula (1).

$R^2$ and $R^3$ each independently represents a hydrogen atom or a protective group. As will be discussed below, the protective group is useful in such a case that it is required to adjust compatibility with water or the developing solution, water-repellency, or solubility in a solvent; however, in normal circumstances, those in which both $R^2$ and $R^3$ are hydrogen atoms are preferably used.

A polymerizable fluoromonomer represented by the general formula (1), in which both $R^2$ and $R^3$ are hydrogen carbons, are concretely exemplified as follows.

[Chemical Formula 7]

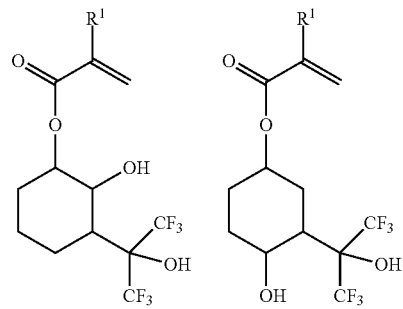

-continued
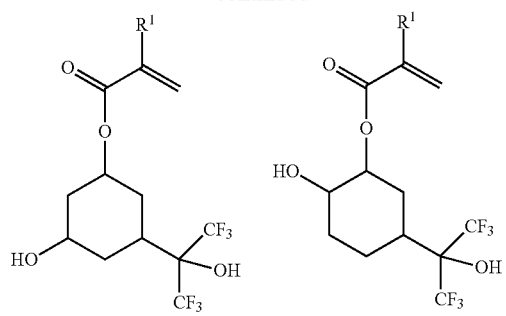
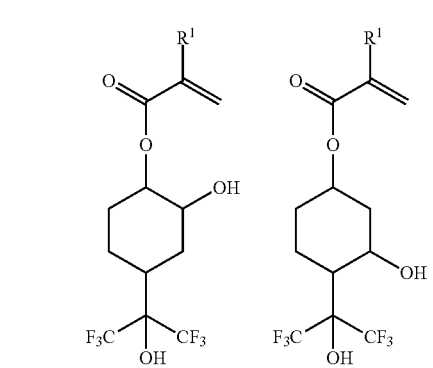
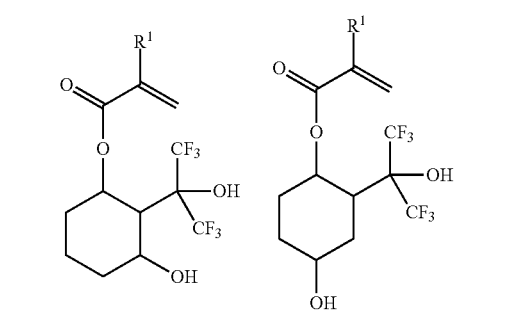
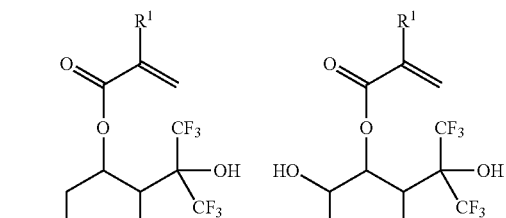
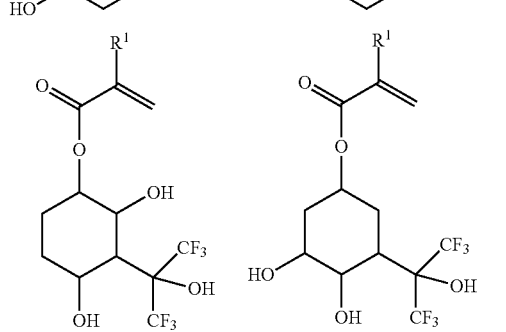
-continued
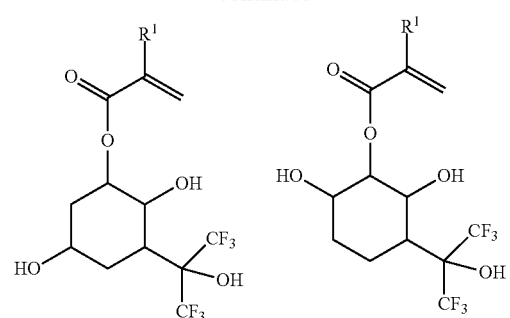
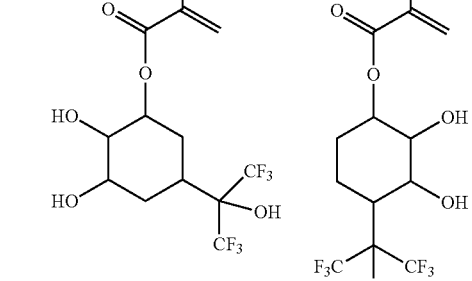
[Chemical Formula 8]
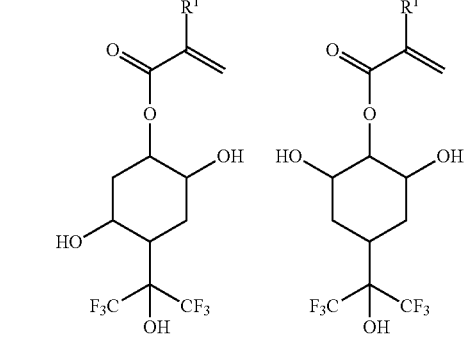
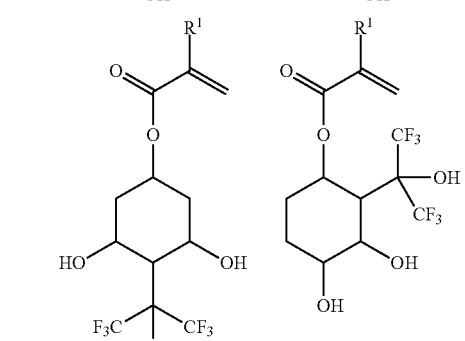
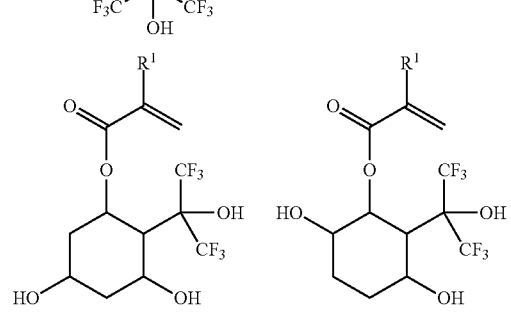

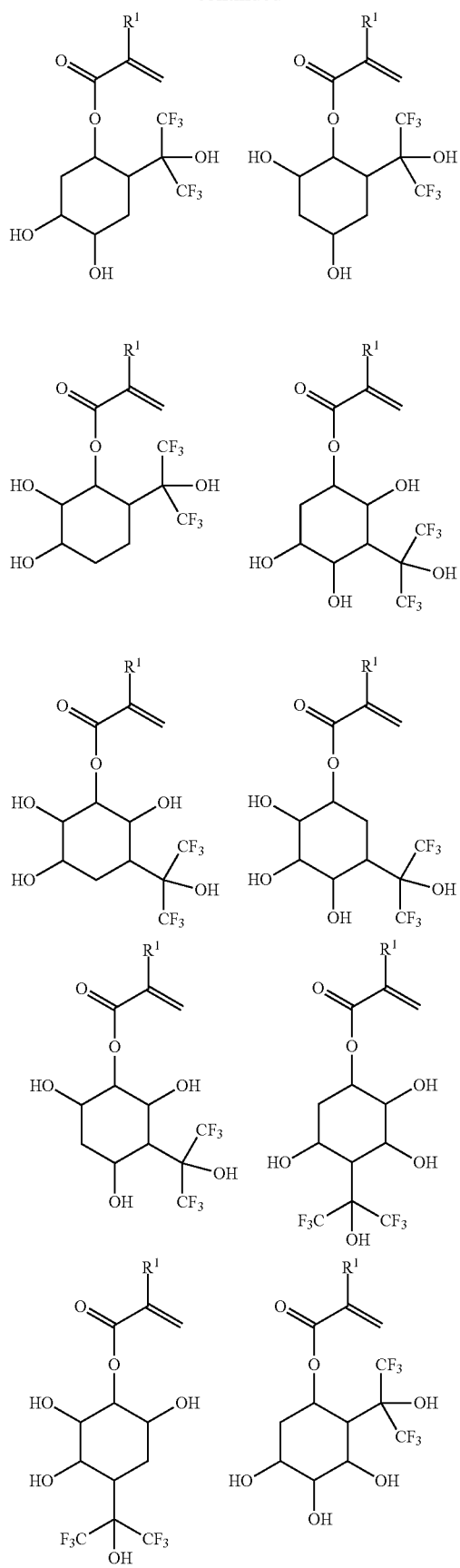
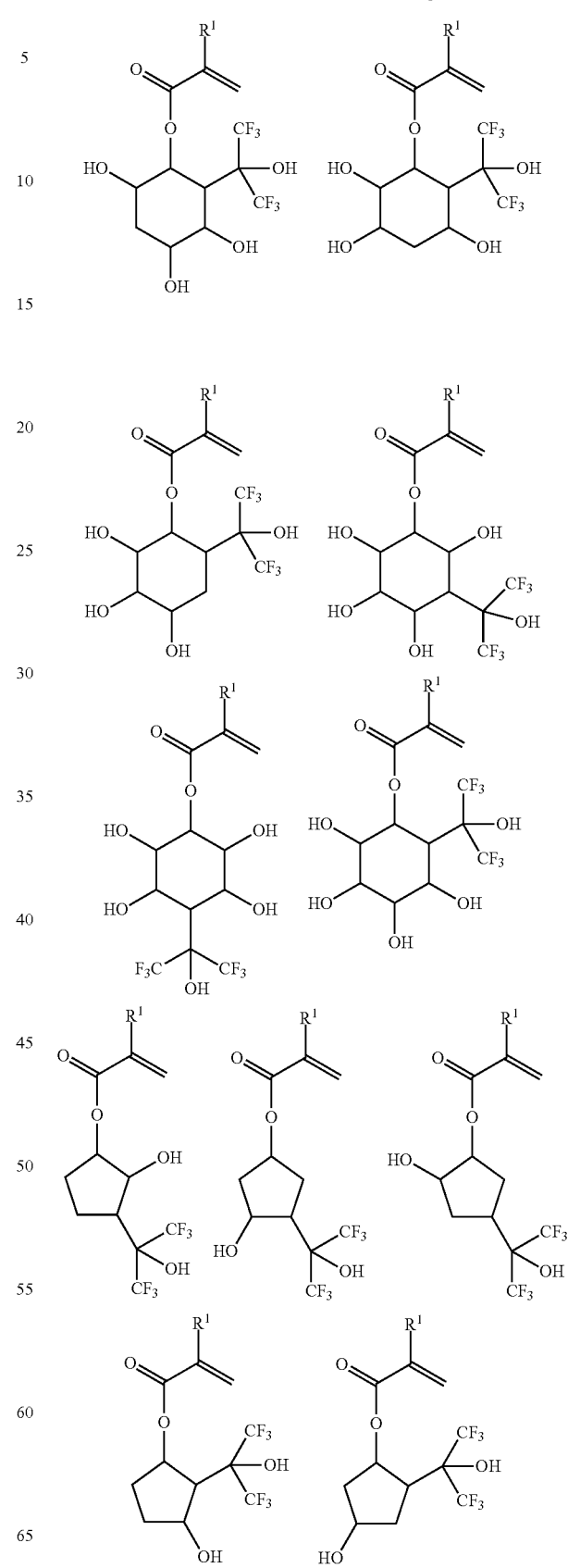
[Chemical Formula 9]

-continued

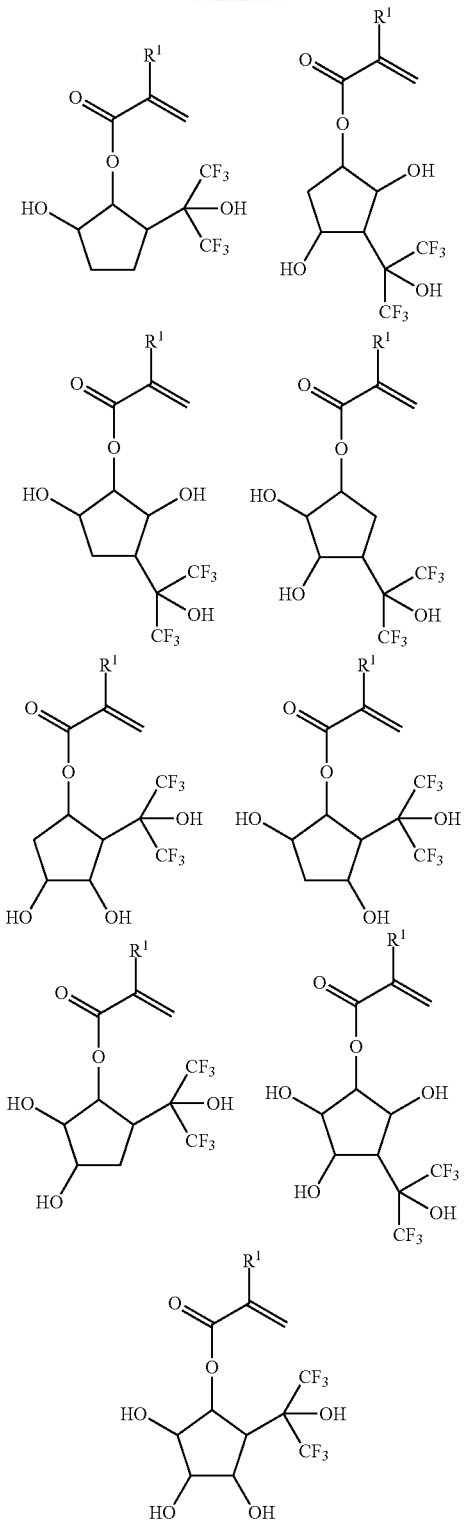

[In the formula, $R^1$ represents a hydrogen atom, methyl group, fluorine atom, or trifluoromethyl group.]

As shown above, the number of hydroxyl groups directly bonded to the ring may take a range of from 1 to 3 in the 5-membered ring, and that from 1 to 4 in the 6-membered ring. The hydroxyl groups are effective at growing solubility in the developing solution, but increase the possibility of causing swelling at the time of development, with increasing the number thereof. Though it somewhat depends on a balance between solubility and swelling performance, the number of the hydroxyl groups prefers 1 to 2 to the case of not less than 3.

Additionally, polymerizability is reduced in the case where the hexafluoroisopropyl hydroxyl group is bonded to a carbon atom in the ring adjacent to a carbon bonding to an ester group, so that a structure where the hexafluoroisopropyl hydroxyl group is bonded to another carbon atom in the ring is preferable.

Additionally, it is preferable that the hexafluoroisopropyl hydroxyl group is adjacent to a hydroxyl group with regard to the availability, cost and easiness to synthesize of the raw material.

In view of the above, any of polymerizable fluoromonomers represented by the following general formula (2), the general formula (3) and general formula (4) is preferably used.

[Chemical Formula 10]

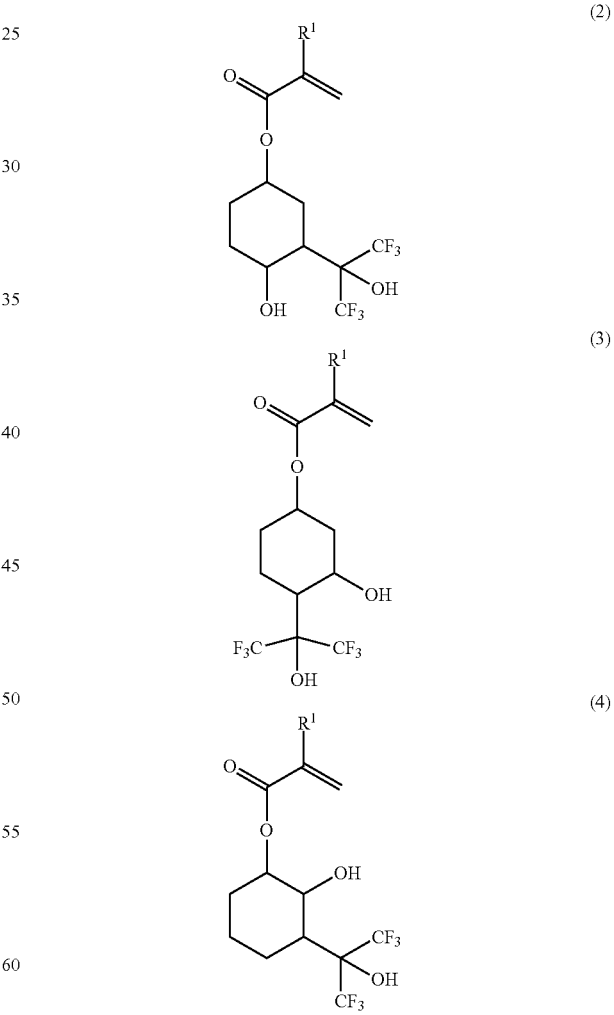

[In the formula, $R^1$ represents the same to that in the general formula (1)]

In the case where it is required to adjust compatibility with water or the developing solution, water-repellency, or solubility in a solvent, a protective group may be used. In a polymerizable fluoromonomer represented by the general formula (1), i.e., in a compound in which $R^2$ and $R^3$ are hydrogen atoms, the hexafluoroisopropyl hydroxyl group or the hydroxyl groups bonding to the ring may be partially or entirely protected with a protective group (this corresponds to the case where $R^2$ or $R^3$ of the general formula (1) is a protective group). Additionally, in the case of using an acid labile protective group as the protective group, it is possible to eliminate it at the time of exposure by the action of a photoacid generator thereby improving solubility in the developing solution.

As the protective group, it can be exemplified by a hydrocarbon group, alkoxycarbonyl group, acetal group, acyl group and the like. The hydrocarbon group is a straight-chain, branched or cyclic hydrocarbon group or aromatic hydrocarbon group having 1 to 25 carbon atoms, and can be exemplified by methyl group, ethyl group, propyl group, isopropyl group, cyclopropyl group, n-propyl group, isopropyl group, sec-butyl group, tert-butyl group, n-pentyl group, cyclopentyl group, sec-pentyl group, neopentyl group, hexyl group, cyclohexyl group, ethylhexyl group, norbornel group, adamantyl group, vinyl group, allyl group, butenyl group, pentenyl group, ethynyl group, phenyl group, benzyl group, 4-methoxybenzyl group and the like. The above-mentioned functional groups may be partially or entirely substituted with fluorine atom. As the alkoxycarbonyl group, it can be exemplified by tert-butoxycarbonyl group, tert-amyloxycarbonyl group, methoxycarbonyl group, ethoxycarbonyl group, i-propoxycarbonyl group and the like. As the acetal group, it can be exemplified by chain-like ether groups of methoxymethyl group, methoxyethoxymethyl group, ethoxyethyl group, butoxyethyl group, cyclohexyloxyethyl group, benzyloxyethyl group, phenethyloxyethyl group, ethoxypropyl group, benzyloxypropyl group, phenethyloxypropyl group, ethoxybutyl group and ethoxyisobutyl group, and cyclic ether groups such as tetrahydrofuranyl group, tetrahydropyranyl group and the like. As the acyl group, it can be exemplified by acetyl group, propionyl group, butyryl group, heptanoyl group, hexanoyl group, valeryl group, pivaloyl group, isovaleryl group, lauryloyl group, myristoyl group, palmytoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydratoropoyl group, atoropoyl group, cinnamoyl group, furoyl group, thenoyl group, nicotinoyl group, isonicotinoyl group and the like. Furthermore, it is also possible to use those in which hydrogen atoms of the above substituents are partially or entirely substituted with fluorine atom.

An aromatic compound into which a hexafluoroisopropyl hydroxyl group is introduced, which serves as an intermediate of polymerizable fluoromonomers represented by the general formulas (1) to (4), is obtained by reacting a corresponding hydroxyl-substituted aromatic compound with hexafluoroacetone, according to the method discussed in the following Non-Patent Publication 2, for example.

"Non-Patent Publication 2" Basil S. Farah, Everett E. Gilbert, Morton Litt, Julian A. Otto, John P. Sibilia J. Org. Chem., 1965, 30(4), pp 1003-1005

Then, a reaction for adding hydrogen to ring is conducted on the intermediate to lead it to a corresponding alicyclic compound (alcohol form). Furthermore, this is esterified with (meth)acrylic acid or a reactive derivative thereof, thereby accomplishing the synthesis.

As an example, a production route of the polymerizable monomer represented by the general formula (3) will be hereinafter exemplified. Resorcinol is prepared as the raw material and a hexafluoroisopropyl hydroxyl group is introduced thereinto. Then, it is led to a corresponding alcohol form with the addition of hydrogen to the ring, followed by esterification, thereby achieving the production.

[Chemical Formula 11]

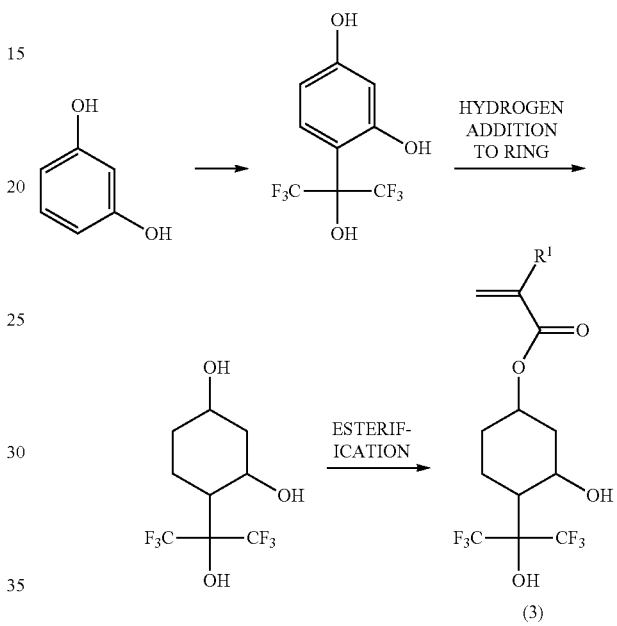

(3)

A method of the addition of hydrogen for ring is not particularly limited and therefore known methods may be used. A method of adding hydrogen by using a Ru/C catalyst together with an organic solvent is preferably adopted.

Additionally, a method for obtaining a polymerizable monomer such as methacrylic acid ester and the like from a corresponding alcohol is not particularly limited, and therefore known esterification methods may be used. As a methacrylic acid derivative, it can be concretely exemplified by acrylic acid, methacrylic acid, trifluoromethylacrylic acid, acrylic acid chloride, methacrylic acid chloride, trifluoromethylacrylic acid chloride, acrylic anhydride, methacrylic anhydride, trifluoromethylacrylic anhydride, and the like.

In esterification, a catalyst may be either used or not used; however, it is possible to use the catalyst for the purpose of obtaining appropriate reaction temperature and reaction rate. As a representative example, it is possible to perform the reaction in the presence of an acid catalyst, in the case of using a carboxylic acid such as acrylic acid, methacrylic acid, trifluoromethylacrylic acid and the like as the raw material. Additionally, it is also possible to perform the reaction in the presence of an acid catalyst or a basic catalyst, in the case of using acid chloride such as acrylic acid chloride, methacrylic acid chloride, trifluoromethylacrylic acid chloride and the like or anhydride such as acrylic anhydride, methacrylic anhydride, trifluoromethylacrylic anhydride and the like. Among these, anhydride is preferably used because a moderate reaction rate is obtained in the case of using it.

The amount of the acrylic acid derivative to be used is satisfactorily not lower than 1 molar time relative to 1 mol of a fluorine-containing alcohol prepared as the raw material, and preferably 1.0 molar time to 5 molar times from the viewpoint of the reaction rate and the yield of the target polymerizable fluoromonomer. Furthermore, the amount of 1.05 molar times to 2 molar times is more preferable.

Usable acid catalysts include proton acids and Lewis acids. If these are exemplified, there are named proton acids such as hydrogen fluoride, sulfuric acid, phosphoric acid, hydrogen chloride, methansulfonic acid, trifluoromethanesulfonic acid, trifluoroacetic acid and the like, and Lewis acids such as aluminum chloride, aluminum bromide, gallium chloride, gallium bromide, ferric chloride (Feel), zinc chloride, antimony chloride, titanium tetrachloride, tin tetrachloride, boron trifluoride, $Ti(OCH_3)_4$, $Ti(OC_2H_5)_4$, $Ti(OC_4H_9)_4$, $Ti(OCH(CH_3)_2)_4$, $Zn(CH_3COO)_2 \cdot 2H_2O$ and the like. Of these, proton acids are preferably used because the target product is obtained with high yields in the case of using them. More preferably, an easily available methanesulfonic acid which can promptly develop the reaction is adopted.

As the amount of the acid catalyst, an amount of from 0.01 to 10 molar times relative to 1 mol of the fluorine-containing alcohol prepared as the raw material may be adopted. The case of 0.01 molar time or less is impractical from the facts that the reaction rate is too slow and that the yield of the target polymerizable fluoromonomer is extremely small. Additionally, even if adding acid of not less than 10 molar times, the effect of improving the yield is not expected, indeed a by-product is increased. It is more preferable to use acid of 0.1 to 1.5 molar times relative to 1 mol of a substrate to achieve a moderate reaction rate and a good yield.

In the case of using anhydride or acid chloride as the raw material, it is good to use base in order to trap acid (carboxylic acid or hydrogen chloride) to be generated by the reaction. As base, there can be used organic bases such as pyridine, lutidine, triethylamine, diethylamine, piperidine, pyrrolidine, 1,8-diazabicyclo[5.4.0]undec-7-ene and the like, in addition to inorganic bases such as sodium hydroxide, sodium carbonate, sodium hydrogencarbonate, potassium hydroxide, potassium carbonate, potassium hydrogencarbonate, sodium hydride, sodium methoxide, sodium ethoxide, sodium tert-butoxide, potassium tert-butoxide and the like. The organic bases are preferably used, in which lutidine is particularly used.

The amount of the base to be used is 1 to 10 molar times and preferably 1 to 3 molar times relative to 1 mol of a fluorine-containing alcohol.

A solvent used in the esterification reaction is not particularly limited so long as it is stable during the reaction and capable of dissolving the fluorine-containing alcohol serving as the raw material. It can be exemplified by hydrocarbons such as hexane, heptane, benzene, toluene, xylene and the like, ethers such as diethyl ether, tetrahydrofuran, dioxane and the like, halogenated hydrocarbons such as dichloromethane, chloroform and the like, and aprotic polar solvent such as acetonitrile, N,N-dimethylformamide, dimethyl sulfoxide, hexamethylphosphoric triamide and the like. These may be used singly or in combination of not less than two kinds thereof.

The reaction temperature in esterification is not particularly limited, and a reaction within a range of from room temperature to 200° C. is possible under normal circumstances. The reaction rate is to change with the kind and amount of the acrylic acid derivative, the acid catalyst and the base and the like, so that the reaction time is changed suitably according to these. In actuality, it is possible to conduct the reaction while successively analyzing a reaction solution during the reaction and to continue the reaction until the raw material is consumed. A process made after the reaction is not particularly limited, and therefore a method of extracting the target product by extraction operation with an organic solvent upon adding the reaction solution to water or ice water or a method of extracting the target product by distillation is practicable.

Then, a fluoropolymer of the present invention will be explained. The fluoropolymer of the present invention means a polymer characterized by containing a repeating unit represented by the general formula (5), and is produced in such a manner that a polymerizable fluoromonomer represented by the general formula (1) singly causes cleavages of its double bonds or in such a manner that the polymerizable fluoromonomer causes copolymerization with another monomer.

[Chemical Formula 12]

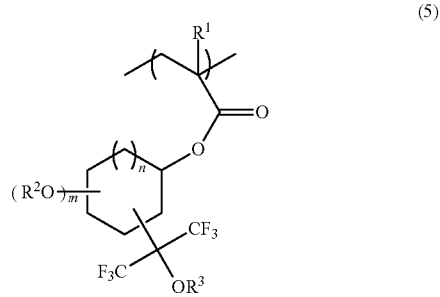

(5)

[In the formula, $R^1$, n, m and $R^2$ or $R^3$ represent the same to those in the general formula (1).]

The repeating unit represented by the general formula (5) is formed by cleavage of a polymerizable double bond of a fluoromonomer represented by the general formula (1), and the other structures are maintained. Hence explanations about $R^1$, $R^2$, $R^3$, n and m and concrete examples of combination of these can apply those in the disclosure about the fluoromonomer represented by the general formula (1) just as these are.

Of repeating units obtained by using the above-mentioned polymerizable fluoromonomers, a fluoropolymer containing at least one of fluoropolymers having repeating units represented by the general formulas (6), (7) and (8) is preferably used.

[Chemical Formula 13]

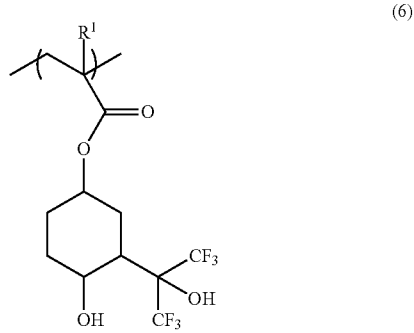

(6)

-continued

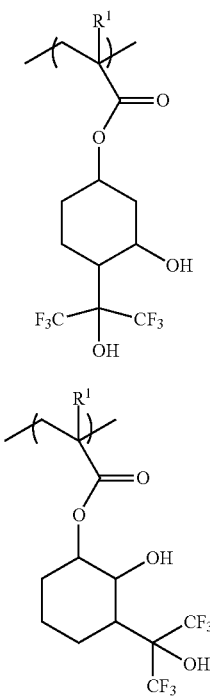

[In the formula, $R^1$ represents the same to that in the general formula (1).]

If monomers copolymerizable with a polymerizable fluoromonomer of the present invention are concretely exemplified, there are named at least one or more kinds selected from maleic anhydride, acrylic esters, fluorine-containing acrylic esters, methacrylic esters, fluorine-containing methacrylic esters, styrene-based compounds, fluorine-containing styrene-based compounds, vinyl ethers, fluorine-containing vinyl ethers, allyl ethers, fluorine-containing allyl ethers, olefins, fluorine-containing olefins, norbornene compounds, fluorine-containing norbornene compounds, sulfur dioxide, vinyl silanes, vinylsulfonic acid and vinylsulfonic ester.

The above-mentioned copolymerizable acrylic ester or methacrylic ester can be used without a particular limitation in terms of ester side chain. If it is exemplified by known compounds, there are named alkyl esters of acrylic acid or methacrylic acid such as methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, n-hexyl acrylate, n-hexyl methacrylate, n-octyl acrylate, n-octyl methacrylate, 2-ethylhexyl acrylate, 2-ethylhexyl methacrylate, lauryl acrylate, lauryl methacrylate, 2-hydroxyethyl acrylate, 2-hydroxyethyl methacrylate, 2-hydroxypropyl acrylate, 2-hydroxypropyl methacrylate and the like, acrylates or methacrylates containing ethylene glycol, propylene glycol or tetramethylene glycol group, unsaturated amides such as acrylamide, methacrylamide, N-methylol acrylamide, N-methylol methacrylamide, diacetone acrylamide and the like, vinyl silanes and acrylic or methacrylic esters containing acrylonitrile, methacrylonitrile or alkoxysilane, tert-butyl acrylate, tert-butyl methacrylate, 3-oxocyclohexyl acrylate, 3-oxocyclohexyl methacrylate, adamantyl acrylate, adamantyl methacrylate, methyladamantyl acrylate, methyladamantyl methacrylate, ethyladamantyl acrylate, ethyladamantyl methacrylate, hydroxyadamantyl acrylate, hydroxyadamantyl methacrylate, cyclohexyl acrylate, cyclohexyl methacrylate, tricyclodecanyl acrylate, tricyclodecanyl methacrylate, an acrylate or methacrylate containing a ring structure such as lactone ring, norbornene ring and the like, acrylic acid, methacrylic acid, and the like. Furthermore, it is possible to perform copolymerization by using the above-mentioned acrylic or methacrylic ester having a cyano group at its α-position, or a similar compound such as maleic acid, fumaric acid, maleic anhydride and the like.

Additionally, the above-mentioned fluorine-containing acrylic esters and fluorine-containing methacrylic esters are a monomer containing at α-position of acryl a fluorine atom or a group having fluorine atom, or an acrylic acid ester or methacrylic acid ester comprised of a substituent having fluorine atom at its ester moiety. Fluorine-containing compounds having fluorine atoms at both α-position and ester moiety are also preferable. Furthermore, a cyano group may be introduced into α-position. For example, as a monomer including α-position into which a fluorine-containing alkyl group is introduced, there is adopted a monomer in which a trifluoromethyl group, trifluoroethyl group, nonafluoro-n-butyl group or the like is provided to α-position of the above-mentioned non-fluorine based acrylic acid esters or methacrylic acid esters.

On the other hand, monomers containing fluorine at its ester moiety are acrylic acid esters or methacrylic acid esters including a unit in which the ester moiety is a fluorine alkyl group that is a perfluoroalkyl group or fluoroalkyl group, or a unit in which a cyclic structure and a fluorine atom are coexistent in the ester moiety, the cyclic structure being those substituted, for example, with a fluorine atom, trifluoromethyl group, hexafluoroisopropyl hydroxyl group or the like. Additionally, acrylic acid or methacrylic acid esters of which ester moiety is a fluorine-containing t-butyl ester group and the like are also usable. It is also possible to use a monomer in which these fluorine-containing functional groups are used in combination with the fluorine-containing alkyl group of α-position. If particularly representative ones of such units are exemplified in the form of monomer, there are named 2,2,2-trifluoroethyl acrylate, 2,2,3,3-tetrafluoropropyl acrylate, 1,1,1,3,3,3-hexafluoroisopropyl acrylate, heptafluoroisopropyl acrylate, 1,1-dihydroheptafluoro-n-butyl acrylate, 1,1,5-trihydrooctafluoro-n-pentyl acrylate, 1,1,2,2-tetrahydrotridecafluoro-n-octyl acrylate, 1,1,2,2-tetrahydroheptadecafluoro-n-decyl acrylate, 2,2,2-trifluoroethyl methacrylate, 2,2,3,3-tetrafluoropropyl methacrylate, 1,1,1,3,3,3-hexafluoroisopropyl methacrylate, heptafluoroisopropyl methacrylate, 1,1-dihydroheptafluoro-n-butyl methacrylate, 1,1,5-trihydrooctafluoro-n-pentyl methacrylate, 1,1,2,2-tetrahydrotridecafluoro-n-octyl methacrylate, 1,1,2,2-tetrahydroheptadecafluoro-n-decyl methacrylate, perfluorocyclohexylmethyl acrylate, perfluorocyclohexylmethyl methacrylate, 6-[3,3,3-trifluoro-2-hydroxy-2-(trifluoromethyl)propyl]bicyclo[2,2,1]hept-2-yl acrylate, 6-[3,3,3-trifluoro-2-hydroxy-2-(trifluoromethyl)propyl]bicyclo[2,2,1]hept-2-yl 2-(trifluoromethyl)acrylate, 6-[3,3,3-trifluoro-2-hydroxy-2-(trifluoromethyl)propyl]bicyclo[2,2,1]hept-2-yl methacrylate, 1,4-bis(1,1,1,3,3,3-hexafluoro-2-hydroxyisopropyl)cyclohexyl acrylate, 1,4-bis(1,1,1,3,3,3-hexafluoro-2-hydroxyisopropyl)cyclohexyl methacrylate, 1,4-bis(1,1,1,3,3,3-hexafluoro-2-hydroxyisopropyl)cyclohexyl 2-trifluoromethyl acrylate, and the like.

Additionally, if a polymerizable monomer usable for copolymerization and having a hexafluoroisopropyl hydroxyl group is exemplified, compounds as discussed below can be named.

[Chemical Formula 14]

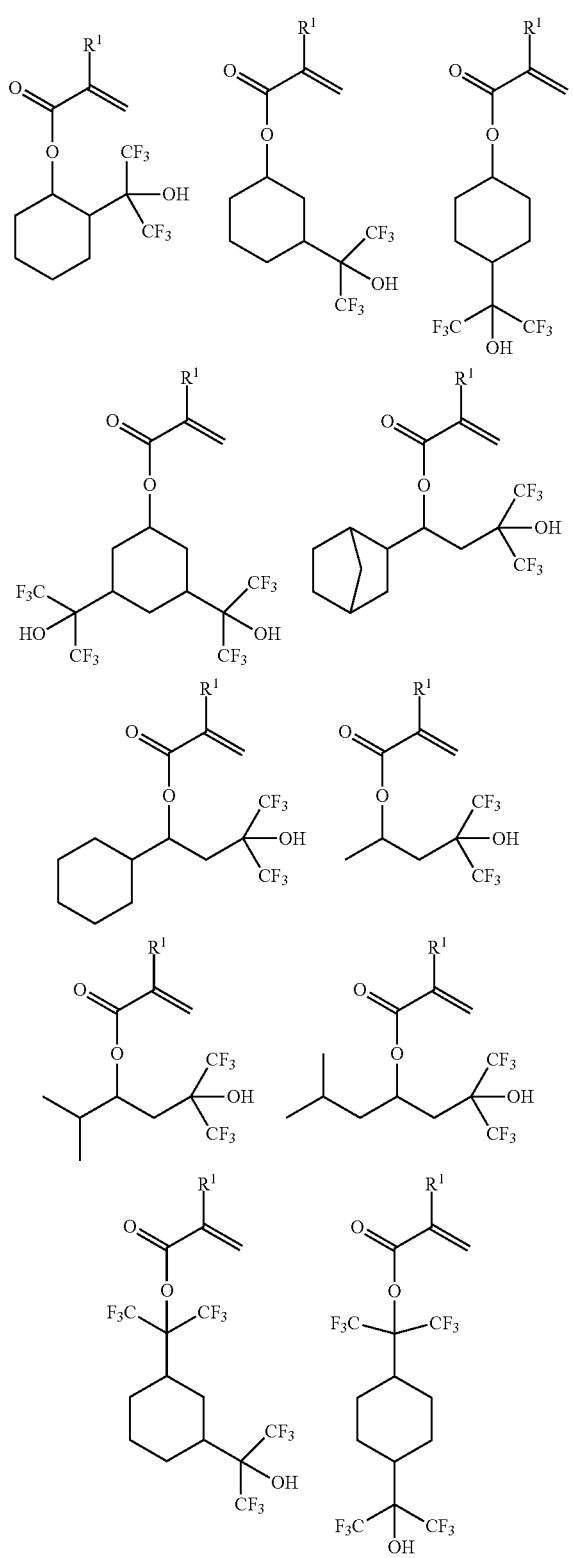
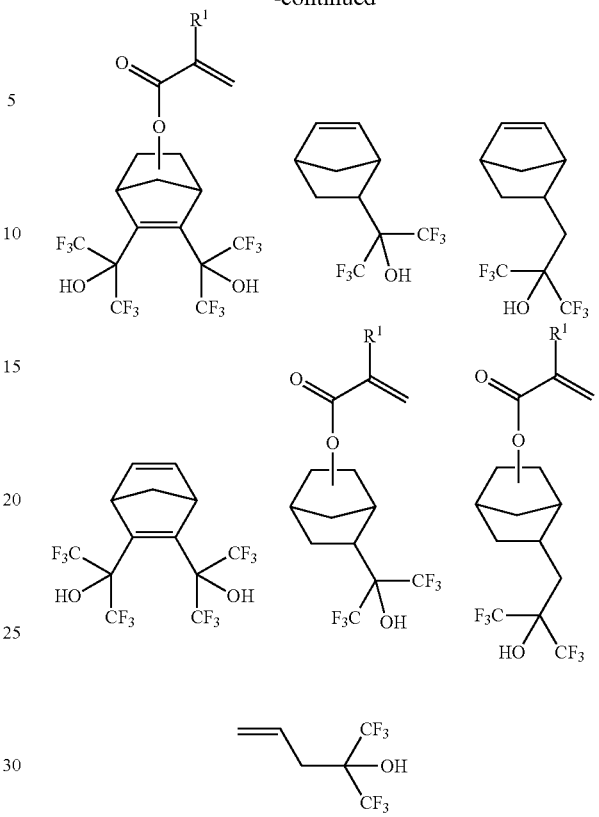

In these formulas, $R^1$ represents a hydrogen atom, methyl group, fluorine atom, or trifluoromethyl group. Additionally, the hexafluoroisopropyl hydroxyl group may be partially or entirely protected with the above-mentioned protective group.

Furthermore, styrene, fluorinated styrene, hydroxystyrene and the like can be used as styrene-based compounds and fluorine-containing styrene-based compounds usable in the present invention. More specifically, there can be used a styrene obtained by substituting hydrogen of an aromatic ring with a fluorine atom or trifluoromethyl group, such as pentafluorostyrene, trifluoromethylstyrene, bistrifluoromethylstyrene and the like, and a styrene obtained by substituting hydrogen of an aromatic ring with a hexafluoroisopropyl hydroxyl group or a functional group obtained by protecting a hydroxyl group thereof. Additionally, the above-mentioned styrenes having α-position to which halogen, alkyl group, or a fluorine-containing alkyl group is bonded, and styrenes having a perfluorovinyl group can be used.

Additionally, as vinyl ethers, fluorine-containing vinyl ethers, allyl ethers or fluorine-containing allyl ethers, which can be used for copolymerization, there can be used alkyl vinyl ethers or alkyl allyl ethers which may have a methyl group, ethyl group, propyl group, butyl group, a hydroxyl group such as hydroxyethyl group, hydroxybutyl group and the like. Additionally, also usable are: cyclic-type vinyl or allylether having a cyclohexyl group, norbornyl group or aromatic ring, or having hydrogen or carbonyl bond in its cyclic structure; and fluorine-containing vinyl ethers and fluorine-containing allyl ethers in which hydrogen of the above-mentioned functional groups is partially or entirely substituted with fluorine atom.

Incidentally, it is also possible in the present invention to use vinyl esters, vinyl silanes, olefins, fluorine-containing olefins, norbornene compounds, fluorine-containing norbornene compounds and other compounds having a polymerizable unsaturated bond, without a particular limitation.

The above-mentioned olefins usable for copolymerization may be exemplified by ethylene, propylene, isobutene, cyclopentene, cyclohexene and the like. The fluorine-containing olefins are exemplified by vinyl fluoride, vinylidene fluoride, trifluoroethylene, chlorotrifluoroethylene, tetrafluoroethylene, hexafluoropropylene, hexafluoroisobutene and the like.

The above-mentioned norbornene compounds and fluorine-containing norbornene compounds, which are usable in copolymerization, are norbornene monomers having a single or plurality of nucleus structures. In this case, those are norbornene compounds produced by Diels Alder addition reaction of cyclopentadiene or cyclohexadiene and unsaturated compounds such as fluorine-containing olefin, allyl alcohol, fluorine-containing allyl alcohol, homoallyl alcohol, fluorine-containing homoallyl alcohol, acrylic acid, α-fluoroacrylic acid, α-trifluoromethylacrylic acid, methacrylic acid, all of the acrylic acid esters, methacrylic acid esters, fluororine-containing acrylic acid esters and fluorine-containing methacrylic acid esters discussed in the present specification, 2-(benzoyloxy)pentafluoropropane, 2-(methoxyethoxymethyloxy)pentafluoropropene, 2-(tetrahydroxypyranyloxy)pentafluoropropene, 2-(benzoyloxy)trifluoroethylene, 2-(methoxymethyloxy)trifluoroethylene, and the like. It is possible to exemplify these by 3-(5-bicyclo[2,2,1]hepten-2-yl)-1,1,1-trifluoro-2-(trifluoromethyl)-2-propanol and the like.

In the case of introducing an acid labile group into a fluoropolymer of the present invention, a polymerizable monomer having the acid labile group may be used. As a monomer having an acid labile group, it is possible to use one in which the hexafluoroisopropyl hydroxyl group or hydroxyl group bonded to the ring of the above-mentioned fluoropolymers represented by the general formulas (1) to (4) is protected with a protective group, i.e., an acid labile protective group; however, in general, a method of initiating copolymerization with other polymerizable monomers having an acid labile group is preferably employed.

Furthermore, as another method for obtaining a polymer or resist material having an acid labile group, it is possible to adopt a method of introducing an acid labile group into a previously obtained polymer by a subsequent polymer reaction or to mix a monomer or polymer having the function of acid labile group therewith.

The purpose of using the acid labile group is to provide a positive-type photosensitivity so as to exhibit solubility in alkali developing solution obtained after exposure to a high-energy ray having 300 nm or less wavelengths, such as ultraviolet rays, an excimer laser, X-ray and the like, or electron beam.

A polymerizable monomer having an acid labile group and usable in the present invention, other than polymerizable fluoromonomers represented by the general formulas (1) to (4), can be used without a particular limitation so long as the acid labile group causes hydrolysis by acid generated from a photoacid generator so as to be eliminated therefrom. A polymerizable group is required only to be alkenyl group or cycloalkenyl group, in which vinyl group, 1-methylvinyl group or 1-trifluoromethylvinyl group. If it is exemplified, monomers having groups represented by the following general formulas (9) to (11) are preferably used.

[Chemical Formula 15]

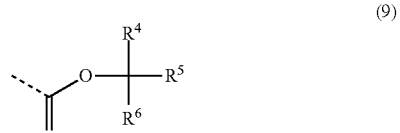

(9)

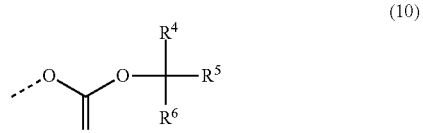

(10)

(11)

Here, $R^4$, $R^5$, $R^6$, $R^7$ and $R^8$ are a straight-chain, branched or cyclic alkyl group having 1 to 25 carbon atoms, which may be the same. The alkyl group may partially contain a fluorine atom, oxygen atom, nitrogen atom, sulfur atom or hydroxyl group. Two of $R^4$, $R^5$ and $R^6$ may be bonded to form a ring.

Concrete examples of the groups represented by the general formulas (9) to (11) are not particularly limited, and can be exemplified by those as follows. Broken lines represent bonds.

[Chemical Formula 16]

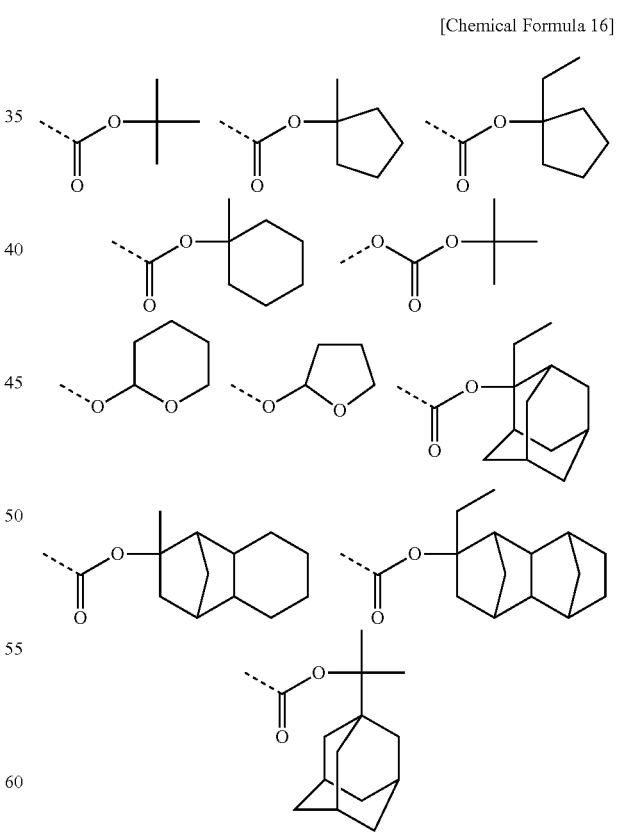

[Chemical Formula 17]

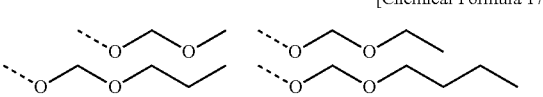

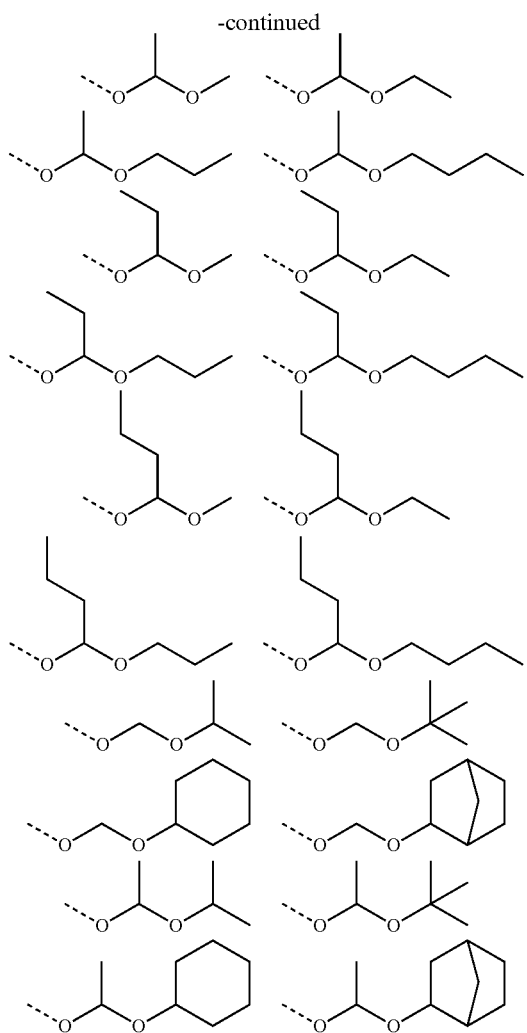

In a fluoropolymer of the present invention, it is possible to introduce a unit having a lactone structure (an adhesive group) for the purpose of improving adhesiveness to a substrate. In introduction of such a unit, a polymerizable monomer having a lactone structure is preferably used. The lactone structure can be exemplified by: monocyclic lactone structures such as groups obtained by eliminating one hydrogen atom from γ-butyrolactone or mevalonic lactone; polycyclic lactone structures such as groups obtained by eliminating one hydrogen atom from norbornane lactone; and the like. By copolymerizing those having such a lactone structure, i.e., acrylic acid ester, methacrylic acid ester or α-trifluoromethylacrylic acid ester so as to incorporate the lactone structure into a resist, it becomes possible not only to improve adhesiveness to the substrate but also to enhance compatibility with the developing solution.

Incidentally, the above-mentioned monomers usable in the present invention and copolymerizable may be used singly or in combination of not less than two kinds thereof.

A fluoropolymer of the present invention may be comprised of repeating units of two or more monomers. The ratio is determined without a particularly limitation, but ranges as discussed below are preferably adopted.

Fluoropolymers of the present invention contain 1 to 100 mol %, more preferably 5 to 90 mol % of repeating units derived from polymerizable fluoromonomers represented by the general formulas (1) to (4). Additionally, the fluoropolymers may contain 1 to 100 mol %, preferably 5 to 80 mol %, more preferably 10 to 60 mol % of repeating units having acid labile groups. Furthermore, the fluoropolymers may contain repeating units not having the acid labile groups due to other polymerizable monomers, and may contain the repeating units in an amount of from 1 to 80 mol %, more preferably from 5 to 50 mol % of all repeating units. In the case where the repeating units formed such that the polymerizable fluoromonomers represented by the general formulas (1) to (4) cause cleavage are smaller than 1 mol %, the effect of the use of the monomers of the present invention is not expected. Additionally, in the case where the repeating units having the acid labile groups are smaller than 1 mol %, a change in solubility in alkali developing solution obtained by exposure is so slight that contrast for patterning is not expected. In this case, a general monomer other than the monomers represented by the general formulas (1) to (4) may be used for formation of the repeating units having the acid labile groups, and alternatively, those obtained by leading monomers represented by the general formulas (1) to (4) to monomers having the acid labile groups may also be acceptable. Alternatively, those into which the acid labile groups are introduced by polymer reaction after polymerization may also be acceptable. The repeating units derived from the other polymerizable monomers not having the acid labile groups are used in order to improve solubility of the fluoropolymer in organic solvents, and etching resistance and mechanical strength of film; however, 1 mol % or less does not exhibit such effects while 80 mol % or more decreases the content of the repeating units formed by cleavage of polymerizable fluoromonomers represented by the general formulas (1) to (4) so as not to sufficiently exhibit such effects, which is therefore not preferable.

A method of polymerizing a fluoropolymer of the present invention is not particularly limited as far as it is a generally usable method. However, radical polymerization, ionic polymerization or the like is preferable and it is also possible to use coordination anion polymerization, living anion polymerization, cation polymerization, ring-opening metathesis polymerization, vinylene polymerization or the like.

The radical polymerization may be conducted by a known polymerization method such as bulk polymerization, solution polymerization, suspension polymerization or emulsion polymerization, in the presence of a radical polymerization initiator or radical initiating source, with a batch-wise, semi-continuous or continuous operation.

The radical polymerization initiator is not particularly limited. As its examples, azo compounds, peroxide compounds and redox compounds are cited. The particularly preferable examples are azobisisobutyronitrile, t-butylperoxypivalate, di-t-butylperoxide, i-butyrylperoxide, lauroylperoxide, succinic acid peroxide, dicinnamylperoxide, di-n-propylperoxydicarbonate, t-butylperoxyallyl monocarbonate, benzoyl peroxide, hydrogen peroxide, ammonium persulfate and the like.

A reaction vessel used in the polymerization reaction is not particularly limited. Additionally, a polymerization solvent may be used in the polymerization reaction. As the polymerization solvent, one that does not interfere with the radical polymerization is preferable. Representative ones are ester-based ones such as ethyl acetate, n-butyl acetate and the like; ketone-based ones such as acetone, methyl isobutyl ketone and the like; hydrocarbon-based ones such as toluene, cyclohexane and the like; and alcohol-based solvents such as methanol, isopropyl alcohol, ethylene glycol monomethyl ether and the like. Additionally, it is also possible to use various solvents, such as water, ether-based ones, cyclic ether-based ones, fluorohydrocarbon-based ones, aromatic ones and the like. These solvents can be used singly or in combination of at least two types. Additionally, a molecular weight adjusting agent such as mercaptan may be used together therewith. The reaction temperature of the polymerization reaction is suitably changed according to the radical polymerization initiator or radical polymerization initiating source, and is preferably 20 to 200° C. in general, particularly preferably 30 to 140° C.

On the other hand, the ring-opening metathesis polymerization can be conducted only by using a transition metal catalyst of the groups 4 to 7 in the presence of a cocatalyst. It can be conducted in a solvent by a known method.

The polymerization catalyst is not particularly limited. Examples thereof include Ti-based, V-based, Mo-based and W-based catalysts. In particular, titanium(IV) chloride, vanadium(IV) chloride, vanadium trisacetylacetonate, vanadium bisacetylacetonatedichloride, molybdenum(VI) chloride, and tungsten(VI) chloride and the like are preferable. The amount of the catalyst is 10 mol % to 0.001 mol %, preferably 1 mol % to 0.01 mol % relative to the used monomer.

As the cocatalyst, alkylaluminum, alkyltin and the like are cited. In particular, it can be exemplified by aluminum-based ones including: trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum and the like; dialkylaluminum halides such as dimethylaluminum chloride, diethylaluminum chloride, diisopropylaluminum chloride, diisobutylaluminumchloride and the like; monoalkylaluminum halides such as methylaluminum dichloride, ethylaluminum dichloride, ethylaluminum diiodide, propylaluminum dichloride, isopropylaluminum dichloride, butylaluminum dichloride, isobutylaluminum dichloride and the like; and alkylaluminum sesquichlorides such as methylaluminum sesquichloride, ethylaluminum sesquichloride, propylaluminum sesquichloride, isobutylaluminum sesquichloride and the like; and by tetra-n-butyltin, tetraphenyltin, triphenylchlorotin and the like. The amount of the cocatalyst is 100 equivalents or less, preferably 30 equivalents or less, by molar ratio, relative to a transition metal catalyst.

The polymerization solvent will do unless it interferes with the polymerization reaction. Its representative examples are: aromatic hydrocarbon-based ones such as benzene, toluene, xylene, chlorobenzene, dichlorobenzene and the like; hydrocarbon-based ones such as hexane, heptane, cyclohexane and the like; and halogenated hydrocarbons such as carbon tetrachloride, chloroform, methylene chloride, 1,2-dichloroethane and the like. Additionally, these solvents may be used singly or in combination of two or more kinds. The reaction temperature is preferably −70 to 200° C. in general, particularly preferably −30 to 60° C.

The vinylene polymerization is required only to use a transition metal catalyst of the groups 8 to 10 such as iron, nickel, rhodium, palladium, platinum and the like, or a metal catalyst of the groups 4 to 6 such as zirconium, titanium, vanadium, chromium, molybdenum, tungsten and the like in the presence of cocatalyst. It can be conducted in a solvent by a known method.

The polymerization catalyst is not particularly limited. Of the examples thereof, the preferable are transition metal compounds of the groups 8 to 10, such as iron(II) chloride, iron(III) chloride, iron(II) bromide, iron(III) bromide, iron (II) acetate, iron(III) acetylacetonate, ferrocene, nickelocene, nickel(II) acetate, nickel bromide, nickel chloride, dichlorohexylnickel acetate, nickel lactate, nickel oxide, nickel tetrafluoroborate, bis(allyl)nickel, bis(cyclopentadienyl)nickel, nickel(II) hexafluoroacetylacetonatetetrahydrate, nickel(II) trifluoroacetylacetonatedihydrate, nickel(II) acetylacetonatetetrahydrate, rhodium(III) chloride, rhodium tris(triphenylphosphine)trichloride, palladium(II) bis(trifluoroacetate), palladium(II) bis(acetylacetonate), palladium (II) 2-ethylhexanoate, palladium(II) bromide, palladium(II) chloride, palladium(II) iodide, palladium(II) oxide, monoacetonitriletris(triphenylphosphine)palladium(II) tretrafluoroborate, tetrakis(acetonitrile)palladium(II) tetrafluoroborate, dichlorobis(acetonitrile)palladium(II), dichlorobis(triphenylphosphine)palladium(II), dichlorobis(benzonitrile)palladium(II), palladium acetylacetonate, palladium bis(acetonitrile)dichloride, palladium bis(dimethylsulfoxide)dichloride, platinum bis(triethylphosphine)hydrobromide and the like; and transition metal compounds of the groups 4 to 6, such as vanadium(IV) chloride, vanadium trisacetylacetonate, vanadium bisacetylacetonatedichloride, trimethoxy(pentamethylcyclopentadienyl)titanium(IV), bis (cyclopentadienyl)titanium dichloride, bis(cyclopentadienyl)zirconium dichloride and the like. The catalyst amount is from 10 mol % to 0.001 mol %, preferably from 1 mol % to 0.01 mol % relative to the used monomer.

As the cocatalyst, alkylaluminoxane, alkylaluminum and the like are cited. In particular, it can be exemplified by: methylaluminoxane (MAO); trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum and the like; dialkylaluminum halides such as dimethylaluminum chloride, diethylaluminum chloride, diisopropylaluminum chloride, diisobutylaluminum chloride and the like; monoalkylaluminum halides such as methylaluminum dichloride, ethylaluminum dichloride, ethylaluminum diiodide, propylaluminum dichloride, isopropylaluminum dichloride, butylaluminum dichloride, isobutylaluminum dichloride and the like; and alkylaluminum sesquichlorides such as methylaluminum sesquichloride, ethylaluminum sesquichloride, propylaluminum sesquichloride, isobutylaluminum sesquichloride and the like. The amount of the cocatalyst is 50 to 500 equivalents in terms of Al conversion in the case of methylaluminoxane. In the case of other alkylaluminums, it is 100 equivalents or less, preferably 30 equivalents or less relative to the transition metal catalyst, by molar ratio.

Additionally, the polymerization solvent will do as long as it does not interfere with the polymerization reaction. As representative ones, it can be exemplified by aromatic hydrocarbon-based ones such as benzene, toluene, xylene, chlorobenzene, dichlorobenzene and the like, hydrocarbon-based ones such as hexane, heptane, nonane, decane, cyclohexane and the like, ketone-based ones such as acetone, methyl ethyl ketone, methyl isopropyl ketone, methyl isobutyl ketone, cyclohexanone, cyclopentanone and the like, ester-based ones such as ethyl acetate, butyl acetate and the like, alcohol-based ones such as methanol, ethanol, propanol, isopropanol, butanol, isobutanol, pentanol, hexanol, nonanol, octanol, 1-octanol, 2-octanol, 3-octanol, 4-methyl-2-pentanol, ethylene glycol and the like, halogenated hydrocarbon-based ones such as carbon tetrachloride, chloroform, methylene chloride, 1,2-dichloroethane and the like, diethyl ether, diisopropyl ether, tetrahydrofuran, diglyme, propylene glycol monomethyl ether acetate (PEGMEA), propylene glycol monoethyl ether acetate, propylene glycol monoethyl ether, propylene glycol monomethyl ether (PEGME), propylene glycol diacetate, propylene glycol monoethyl ether, ethyl lactate (EL), dimethylformamide, N-methylpyrolidone, N-cyclohexylpyrolidone and the like. Additionally, these solvents may be used singly or in combination of two or more kinds. The reaction temperature is preferably −70 to 200° C. in general, particularly preferably −40 to 80° C.

As a method of removing an organic solvent or water, which serve as mediums, from a solution or dispersion liquid of the thus obtained fluoropolymer of the present invention, any known methods can be used. If these are exemplified, methods such as reprecipitation filtration, heating distillation under reduced pressure and the like are cited.

As the number average molecular weight of a fluoropolymer of the present invention, a range of generally from 1,000 to 100,000, preferably from 3,000 to 50,000 is appropriate. The molecular weight distribution is 1 to 4, preferably 1 to 2.5.

In the use as a resist, solubility and casting property may be changed according to the molecular weight. There is a possibility that a dissolution rate in the developing solution is decreased with a high molecular weight polymer and that the dissolution rate is increased in the case of a low molecular weight; however, it is possible to control the molecular weight by suitably adjusting polymerization conditions on the basis of common sense in this technical field.

(About Preparation of Resist)

A fluoropolymer of the present invention is preferably used as a positive-type photosensitizing resist material in particular. The present invention provides a resist material containing the above-mentioned fluoropolymer, and more specifically, a positive-type resist material. As the resist material in this case, those containing (A) the above-mentioned fluoropolymer as a base resin, (B) a photoacid generator, (C) a basic compound and (D) a solvent are preferable. Additionally, it may contain (E) a surfactant, as necessary.

(A) Photoacid Generator

A photoacid generator used for the resist material of the present invention is not particularly limited, and therefore an arbitrary one selected from those used as acid generators for chemically amplified resists can be used. The acid generators can be exemplified by onium sulfonate such as iodonium sulfonate, sulfonium sulfonate and the like, sulfonic ester, N-imidesulfonate, N-oximesulfonate, o-nitrobenzyl sulfonate, trismethane sulfonate of pyrogallol and the like.

Acids to be generated from these photoacid generators by the action of light include alkanesulfonic acid, aryl sulfonate, a partially or entirely fluorinated aryl sulfonate or alkanesulfonic acid, and the like, in which a photoacid generator which is to generate a partially or entirely fluorinated alkanesulfonic acid is effective because it has a sufficient acid strength even against protective groups hard to deblock. Concretely, triphenylsulfonium trifluoromethanesulfonate, triphenylsulfonium perfluoro-n-octanesulfonate and the like can be cited.

(C) Basic Compound

It is possible to mix a basic compound into a resist material of the present invention. The basic compound has the function of suppressing the diffusion velocity exhibited when acid generated by an acid generator diffuses into a resist film, with which the effect of so adjusting the diffusion length of the acid as to improve a pattern resist shape and a stability during time delay is expected. If the basic compound is exemplified, aliphatic amine, aromatic amine, heterocyclic amine, aliphatic polycyclic amine and the like are cited. Secondary or tertiary aliphatic amine is preferably adopted, and alkyl alcohol amine is more preferably adopted. Concrete examples are trimethylamine, triethylamine, tripropylamine, tributylamine, tripentylamine, trihexylamine, triheptylamine, trioctylamine, trinonylamine, tridecanylamine, tridodecylamine, dimethylamine, diethylamine, dipropylamine, dibutylamine, dipentylamine, dihexylamine, diheptylamine, dioctylamine, dinonylamine, didecanylamine, didodecylamine, dicyclohexylamine, methylamine, ethylamine, propylamine, butylamine, pentylamine, hexylamine, heptylamine, octylamine, nonylamine, decanylamine, diethanolamine, triethanolamine, diisopropanolamine, triisopropanolamine, dioctanolamine, trioctanolamine, aniline, pyridine, picoline, lutidine, bipyridine, pyrrole, piperidine, piperazine, indole, hexamethylenetetramine and the like. These may be used singly or in combination of two or more kinds. Additionally, the mixture amount thereof is preferably from 0.001 to 2 parts by weight relative to 100 parts by weight of a polymer, more preferably from 0.01 to 1 part by weight relative to 100 parts by weight of the polymer. When the mixture amount is smaller than 0.001 part by weight, the effect of additive is not sufficiently provided. When exceeding 2 parts by weight, resolution performance or sensitivity is sometimes reduced.

(D) Solvent

A solvent used for a resist material of the present invention is required only to dissolve the mixed components to provide a uniform solution, and may be selected from conventional solvents for resist. Additionally, it is possible to use two or more kinds of solvents in combination. If the solvents are exemplified, the usable ones are: ketones such as acetone, methyl ethyl ketone, cyclopentanone, cyclohexanone, methyl isobutyl ketone, methyl isopentyl ketone, 2-heptanone and the like; alcohols such as isopropanol, butanol, isobutanol, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, isoamyl alcohol, 2-ethyl-1-butanol, lauryl alcohol, hexyl decanol, oleyl alcohol and the like; polyhydric alcohols and derivatives thereof, such as ethylene glycol, diethylene glycol, propylene glycol, dipropylene glycol, ethylene glycol monoacetate, diethylene glycol monoacetate, propylene glycol monoacetate, dipropylene glycol monoacetate, propylene glycol monomethyl ether, propylene glycol monoethyl ether, propylene glycol monopropyl ether, propylene glycol monobutyl ether, propylene glycol monomethyl ether acetate (PGMEA), propylene glycol monomethyl ether(PGME) and the like; esters such as methyl lactate, ethyl lactate (EL), methyl acetate, ethyl acetate, butyl acetate, methyl pyruvate, ethyl pyruvate, methyl methoxypropionate, ethyl ethoxypropionate and the like; aromatic solvents such as toluene, xylene and the like; ethers such as diethyl ether, dioxane, anisole, diisopropyl ether and the like; fluoroine-based solvents such as freon, alternative freon, perfluoro compounds, hexafluoroisopropyl alcohol and the like; and terpene-based petroleum naphtha solvents and paraffinic solvents, which are high-boiling-point, weak solvents, for the purpose of increasing applicability.

Of these, propylene glycol monomethyl ether acetate (PGMEA), propylene glycol monomethyl ether (PGME) and ethyl lactate (EL) are particularly preferably adopted.

The amount of the solvent to be mixed into the resist is not particularly limited; however, it is preferably used such that the concentration of a solid content of the resist is from 3 to 25%, more preferably from 5 to 15%. By adjusting the concentration of the solid content of the resist, it becomes possible to adjust the film thickness of a film of a resin to be formed.

Furthermore, a fluoropolymer of the present invention is excellent in solubility in a wide variety of solvents, and it is worthy of note that the fluoropolymer dissolves in alcohol-based solvents having 5 to 20 carbon atoms among the above-mentioned alcohol-based solvents. As concrete examples of the alcohols, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, iso-amyl alcohol, 2-ethyl-1-butanol, lauryl alcohol, hexyl decanol, oleyl alcohol and the like are cited.

If taking the fact that resist materials used for general purposes do not dissolve in the alcohol-based solvents having 5 or more carbon atoms into account, a resist material of the present invention not only allows a wide use of solvents in a common resist pattern formation method but also is useful as a resist material for a pattern formation method conducted according to a double patterning process as discussed below, so as to be able to develop for novel purposes.

(E) Surfactant

According to need, a surfactant may be added to a resist composition of the present invention. As the surfactant, any one or two or more kinds of a fluorine-based surfactant, silicon-based surfactant and a surfactant having both fluorine atom and silicon atom may be contained therein.

(Method for Pattern Formation)

A method for forming a pattern in the use of the resist material of the present invention is comprised of a step of applying the resist material onto a substrate, a step of exposing the resist material to a high-energy ray of a wavelength of 300 nm or less through a photomask after heating treatment, and a step of developing the resist material by using an alkali developing solution after heating treatment. Any of these can be performed by adopting a known lithography technique.

For example, a resist material is applied onto a silicon wafer by a spin coating technique to form a thin layer thereon, first of all. This is then subjected to a prebaking on a hot plate at 60 to 200° C. for 10 seconds to 10 minutes, preferably at 80 to 150° C. for 30 seconds to 2 minutes. Then, a mask for forming a desired pattern is disposed, upon which exposure was conducted with a high-energy ray such as ultraviolet rays, an excimer laser and X-rays or electron beam such that its exposure value is 1 to 200 $mJ/cm^2$, preferably 10 to 100 $mJ/cm^2$. Thereafter, a heating treatment, i.e., a post exposure bake (PEB) was conducted on a hot plate at 60 to 150° C. for 10 seconds to 5 minutes, preferably at 80 to 130° C. for 30 seconds to 3 minutes. Furthermore, development was conducted for 10 seconds to 3 minutes, preferably 30 seconds to 2 minutes, by an existing method such as dipping method, paddling method, spraying method and the like by using a developing solution formed of a 0.1 to 5%, preferably 2 to 3% alkali aqueous solution such as tetramethylammonium hydroxide (TMAH) and the like, with which the desired pattern is formed. Incidentally, the above-mentioned post exposure bake (PEB) may be carried out if necessary.

As the substrate used in the present invention, it is possible to use a substrate formed of metal or glass, in addition to a silicon wafer. Additionally, the substrate may be formed with an organic or inorganic film thereon. For example, an antireflective film, or an underlayer of multi-layer resist may be formed. Furthermore, a pattern may be formed thereon.

Incidentally, the resist material of the present invention is not particularly limited in wavelength to be used for exposure; however, it can be preferably used for micropatterning with KrF excimer laser, ArF excimer laser, $F_2$ laser, EUV, EB or X-rays. In particular, the resist material is preferably adopted for ArF excimer laser.

Additionally, the resist material of the present invention can be preferably used as a resist material for immersion exposure. More specifically, in a method of conducting exposure upon filling a space defined between a resist and a lens with a medium having a larger refractive index than air, such as water and the like, the resist material provides a high waterproof and the compatibility with developing solution while exhibiting a moderate water repellency, thereby allowing forming a fine pattern. In photolithography using immersion exposure, there are cases of using and not using a topcoat serving as a protective film of a resist. The resist material of the present invention can be applied in either case by adjusting the composition and preparation.

As a medium for immersion exposure, it is possible to cite a fluorine-based solvent, a silicon-based solvent, a hydrocarbon-based solvent, a sulfur-containing solvent and the like, in addition to water. The resist material of the present invention can widely apply these.

(About Pattern Formation Method Using Double Patterning Process)

It is possible to use the resist material of the present invention as a resist material serving as a second layer of a double patterning process. A pattern formation method using the double patterning process will be discussed as another embodiment of the present invention.

Incidentally, "a first resist film" refers to a resist film formed firstly in the following pattern formation method, and additionally a resist pattern formed on the resist film through a treatment including exposure, development and the like is referred to as "a first resist pattern". Likewise, "a second resist film" refers to a resist material formed at the surface of "the first resist pattern" to serve as a second layer, and additionally "a second resist pattern" is a term referring to a resist pattern formed on the resist film.

Additionally, in the explanation as will be discussed below, a resist material which provides the first resist film is sometimes referred to as "a first resist material" for convenience, and a resist material which provides the second resist film is sometimes referred to as "a second resist material" for convenience.

In a method cited as an embodiment of the double patterning process, development is performed after conducting exposure and heating treatment on a first resist film formed on a silicon wafer, and thereafter exposure is carried out with a pattern different from that in the first resist film on a second resist film formed thereon, followed by development treatment. With this operation, it becomes possible to form a pattern finer than conventional patterns. Incidentally, before application of the second resist film, a freezing treatment may be conducted for the purpose of maintaining the pattern formed on the first resist film.

Hereinafter, the pattern formation method using the double patterning process will be discussed in more detail. Incidentally, each step of application, heating treatment, exposure and developing process can be performed by the same technique as the above-mentioned "pattern formation method".

First of all, a first resist material is prepared and applied to a silicon wafer by spin coating method and then subjected to heating treatment, thereby forming a first resist film. Thereafter, exposure and development are performed by irradiation with a high-energy ray having 300 nm or less wavelengths through a photomask, thereby forming a first resist pattern on the first resist film.

After that, a second resist material which has been dissolved in a solvent is applied to the first resist pattern and then subjected to heating treatment, thereby forming a second resist film. At this time, the solvent is required not to affect the first resist pattern.

Furthermore, the second resist film is exposed to a high-energy ray having 300 nm or less wavelengths through a photomask. By using a photomask having a pattern different from that in the first resist film, exposure for forming a fine pattern is achieved.

Thereafter, heating treatment (post exposure bake; PEB) is conducted as necessary, followed by a process of developing it with a developing solution, thereby forming a second resist pattern. As the developing solution, a developing solution formed of an alkali aqueous solution such as tetramethylammonium hydroxide (TMAH) and the like is preferably used, as discussed above.

In the above-mentioned pattern formation method using the double patterning process, it is required to ensure the optimization of the combination of the first resist material and the solvent therefore, and that of the second resist material and the solvent therefore.

The pattern formation method using the double patterning process, according to the present invention is one that proposes using a resist material containing a fluoropolymer having a repeating unit specified in the present invention, as the second resist material, upon preparing it with a specified solvent. Hereinafter, suitable combinations will be discussed.

In the pattern formation method of the present invention which method uses the double patterning process, the solvent used for the second resist material is not particularly limited so long as it is not a solvent which affects the first resist pattern; however, in the case where a resist composition for general purposes is used as the first resist composition, an alcohol-based solvent having 5 to 20 carbon atoms is preferably used.

A resist composition for general purposes discussed hereby does not refer to a resist resin having a repeating unit into which a particular unit, e.g., a hexafluoroisopropyl hydroxyl group, but refers to a resist composition that uses a resin having a repeating unit in which a soluble group such as carboxylic acid and the like is protected with a unit formed of an alicyclic hydrocarbon such as an adamantine ring, cyclopentane ring and the like. It is not required to contain a fluorine atom. As the resist composition, a resist composition containing a copolymer formed of, for example, hydroxyadamantyl methacrylate (MA-HAD), ethyladamantyl methacrylate (MA-EAD) and γ-butyrolactone methacrylate (MA-GBL) is preferably used. Such a copolymer is soluble in polyhydric alcohol derivatives such as propylene glycol monomethyl ether acetate (PGMEA), propylene glycol monomethyl ether(PGME) and the like or esters such as ethyl lactate (EL) and the like, but insoluble in alcohol-based solvents having 5 to 20 carbon atoms, such as 4-methyl-2-pentanol (Reference Example 2).

On the other hand, the fluoropolymer of the present invention is excellent in solubility in a wide variety of solvents and soluble in alcohol-based solvents having 5 to 20 carbon atoms such as 4-methyl-2-pentanol (MIBC).

The alcohol-based solvents having 5 to 20 carbon atoms can be exemplified by n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, isoamyl alcohol, 2-ethyl-1-butanol, lauryl alcohol, hexyl decanol, oleyl alcohol and the like. Tert-pentanol, 4-methyl-2-pentanol, 3-methyl-3-pentanol and 2,3-dimethyl-2-pentanol are particularly preferable.

More specifically, a resist composition obtained by preparing a fluoropolymer of the present invention in the use of the alcohol-based solvents having 5 to 20 carbon atoms is useful as a resist composition (the above-mentioned second resist composition) to be applied to the second layer of the double patterning process.

In the double patterning process, it is possible to use one obtained by previously applying the first resist material and forming a pattern thereon, as a substrate. In this case, it is required only to perform operations including a process for applying the above-mentioned second resist material and afterward, as a subsequent operation, in which a patter is formed by carrying out a step of applying a resist material onto a substrate on which previously a resist pattern is formed, a step of exposing the resist material to a high-energy ray having 300 nm or less wavelengths through a photomask after heating treatment, and a step of developing the resist material by using a developing solution after performing heating treatment as necessary. As a resist material usable in this case, it is possible to use the resist material of the present invention, and the above-mentioned alcohol-based solvents having 5 to 20 carbon atoms are preferably used as a solvent used at the time of preparing this resist material. Incidentally, a substrate on which a pattern is previously formed, discussed hereby, is not necessarily one subjected to development, and is required only to achieve the maintenance of the pattern with a freezing treatment or the like.

By the pattern formation method of the present invention, it is possible to produce a device (a semiconductor device). The device is not particularly limited but exemplified by semiconductor devices produced through a microfabrication, such as CPU, SRAM, DRAM and the like formed on silicon wafers, compound semiconductor substrates, insulation substrate, or the like.

EXAMPLES

The present invention will be hereinafter explained in detail with reference to examples, but the present invention is not limited by the following examples.

Monomer Synthesis Example 1

Synthesis of Compound 4 (MA3-4OH)

(1) Synthesis of Compound 2: 1-(1,1,1,3,3,3-hexafluoro-2-hydroxy-2-propyl)-2,5-dihydroxybenzene

[Chemical Formula 18]

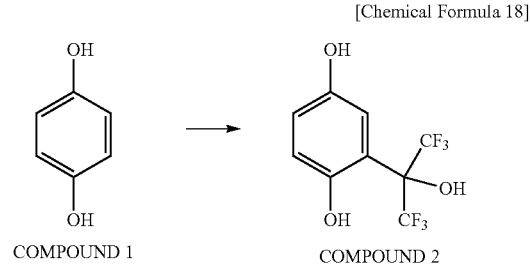 [SMILES: Oc1ccc(O)cc1 ; Oc1ccc(O)c(C(O)(C(F)(F)F)C(F)(F)F)c1]

A 2,000 ml inner capacity of pressure-resistant reactor having a stirrer and a thermometer and formed of SUS316 was charged with 200 g (1.82 mol) of hydroquinone (Compound 1), 17.3 g (0.091 mol) of p-toluenesulfonic acid and 600 ml of toluene, and then closed. Thereafter, the reactor was degassed by a vacuum pump, followed by introducing 332 g (2.00 mol) of 1,1,1,3,3,3-hexafluoroacetone thereinto with stirring. The temperature of the reactor was increased up to 100° C., upon which stirring was continued for 30 hours.

After termination of the reaction, the content was retrieved and 400 ml of diisopropyl ether and 400 ml of water were added thereto, followed by stirring. It was set aside to separate an organic layer therefrom, and the organic layer was rinsed with 200 ml of saturated brine two times. The obtained solution was concentrated and then heated up to 80° C. upon the addition of 800 ml of a 1:2 mixture solvent of toluene and heptane, followed by allowing it to cool slowly to cause recrystallization. A crystal was filtered out and dried, thereby obtaining 370 g of 1-(1,1,1,3,3,3-hexafluoro-2-hydroxy-2-propyl)-2,5-dihydroxycyclobenzene (Compound 2). The yield was 72%.

$^1$H-NMR (Solvent: Deuterated acetone, Standard Substance: TMS); δ (ppm) 6.82-7.05 (3H, m), 8.87 (3H, bs)

$^{19}$F-NMR (Solvent: Deuterated acetone, Standard Substance: CCl$_3$F); δ (ppm) −75.05 (6F, s)

(2) Synthesis of Compound-3: (1,1,1,3,3,3-hexafluoro-2-hydroxy-2-propyl)-2,5-dihydroxycyclohexane

[Chemical Formula 19]

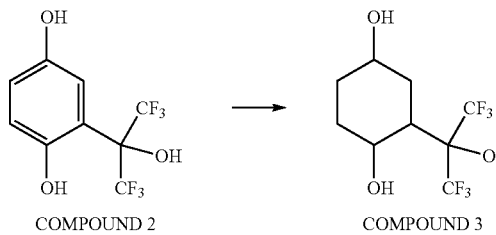

COMPOUND 2 → COMPOUND 3

A 2,000 ml inner capacity of pressure-resistant reactor having a stirrer and a thermometer and formed of SUS316 was charged with 800 ml of diisopropyl ether, 350 g (1.27 mol) of Compound 2 and 17.5 g of 5% Ru/C (a substance containing 50% of water, produced by N.E. CHEMCAT), and then closed. Thereafter, stirring was started and then the interior of the reactor was substituted with hydrogen, followed by setting hydrogen pressure at 3.0 MPa. The temperature of the reactor was increased up to 130° C., upon which stirring was continued for 20 hours.

After termination of the reaction, the content was retrieved and a catalyst was separated by filtration in the use of sellite. The obtained filtrate was concentrated and then heated up to 80° C. upon the addition of 800 ml of a 1:2 mixture solvent of toluene and heptane, followed by allowing it to cool slowly to cause recrystallization. A crystal was filtered out and dried, thereby obtaining 283 g of 1-(1,1,1,3,3,3-hexafluoro-2-hydroxy-2-propyl)-2,5-dihydroxyhexane (Compound 3). The yield was 79%. Compound 3 was obtained mainly in the form of a mixture of two kinds of isomers (Compound 3A:Compound 3B=64:36).

Compound 3A $^1$H-NMR (Solvent; Deuterated acetone, Standard Substance; TMS); δ (ppm) 1.20-2.80 (7H, m), 3.82 (1H, s), 4.17 (1H, s), 4.61 (1H, s), 5.20 (1H, s), 7.29 (1H, s)

$^{19}$F-NMR (Solvent; Deuterated acetone, Standard Substance; CCl$_3$F); δ (ppm) −71.25 (3F, q, J=12 Hz), −73.86 (3F, q, J=12 Hz)

Compound 3B $^1$H-NMR (Solvent; Deuterated acetone, Standard Substance; TMS); δ (ppm) 1.20-2.80 (7H, m), 3.63 (1H, s), 3.95 (1H, s), 4.54 (1H, s), 5.24 (1H, s), 7.29 (1H, s)

$^{19}$F-NMR (Solvent; Deuterated acetone, Standard Substance; CCl$_3$F); δ (ppm) −71.25 (3F, q, J=12 Hz), −73.86 (3F, q, J=12 Hz)

(3) Synthesis of Compound 4 (MA3-4OH): (1,1,1,3,3,3-hexafluoro-2-hydroxy-2-propyl)-2-hydroxycyclohex-5-yl methacrylate

[Chemical Formula 20]

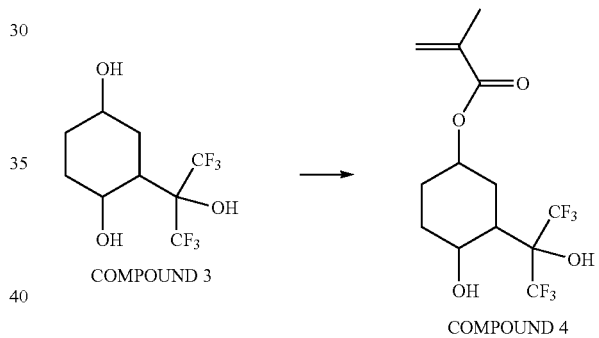

COMPOUND 3 → COMPOUND 4

A 3,000 ml four-neck flask having a stirrer, a thermometer and a reflux condenser was charged with 270 g (0.96 mol) of Compound 3, toluene (1,200 ml), 18.4 g (0.191 mol) of methanesulfonic acid and 155 g (1.01 mol) of methacrylic anhydride, followed by stirring at 70° C. for 4 hours.

After termination of the reaction, a reaction liquid was retrieved. Upon the addition of 800 ml of diisopropyl ether, it was rinsed with a sodium hydrogencarbonate aqueous solution and saturated brine in this order. The obtained solution was concentrated and then heated up to 70° C. upon the addition of 600 ml of a 1:2 mixture solvent of toluene and heptane, followed by allowing it to cool slowly to cause recrystallization. A crystal was filtered out and dried, thereby obtaining 1-(1,1,1,3,3,3-hexafluoro-2-hydroxy-2-propyl)-2-hydroxycyclohex-5-yl methacrylate (Compound 4; MA3-4OH, 113 g). The yield was 34%.

$^1$H-NMR (Solvent: CDCl$_3$, Standard Substance: TMS); δ (ppm) 1.95 (3H, 5), 1.55-2.60 (8H, m), 4.71 (1H, s), 5.27 (1H, s), 5.58 (1H, s), 5.94 (1H, s), 6.08 (1H, 5)

$^{19}$F-NMR (Solvent: CDCl$_3$, Standard Substance: CCl$_3$F); δ (ppm) −72.42 (3F, q, J=12 Hz), −74.72 (3F, q, J=12 Hz)

Monomer Synthesis Example 2

Synthesis of Compound 8 (MA4-3OH)

(1) Synthesis of Compound 6: 1-(1,1,1,3,3,3-hexafluoro-2-hydroxy-2-propyl)-2,4-dihydroxybenzene

[Chemical Formula 21]

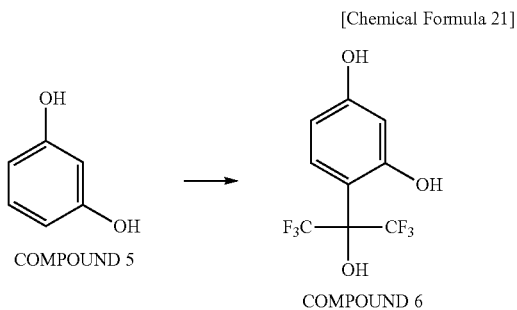 [SMILES: Oc1cccc(O)c1 ; Oc1ccc(C(O)(C(F)(F)F)C(F)(F)F)c(O)c1]

Compound 5 (resorcinol) was prepared as a raw material and reacted with 1,1,1,3,3,3-hexafluoroacetone, thereby synthesizing 1-(1,1,1,3,3,3-hexafluoro-2-hydroxy-2-propyl)-2,4-dihydroxybenzene (Compound 6). Incidentally, the synthesis was carried out by a method set forth in the following Non-Patent Publication 2.

"Non-Patent Publication 2"
Basil S. Farah, Everett E. Gilbert, Morton Litt, Julian A. Otto, John P. Sibilia, J. Org. Chem., 1965, 30(4), pp 1003-1005

(2) Synthesis of Compound 7: 1-(1,1,1,3,3,3-hexafluoro-2-hydroxy-2-propyl)-2,4-dihydroxycyclohexane

[Chemical Formula 22]

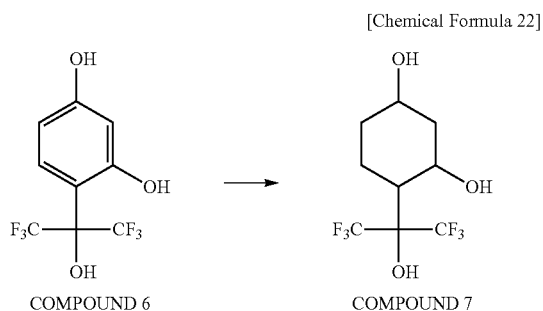

A 2,000 ml inner capacity of pressure-resistant reactor having a stirrer and a thermometer and formed of SUS316 was charged with 800 ml of diisopropyl ether, 350 g (1.27 mol) of Compound 6 and 17.5 g of 5% Ru/C (a substance containing 50% of water, produced by N.E. CHEMCAT), and then closed. Thereafter, stirring was started and then the interior of the reactor was substituted with hydrogen, followed by setting hydrogen pressure at 3.0 MPa. The temperature of the reactor was increased up to 130° C., upon which stirring was continued for 20 hours.

After termination of the reaction, the content was retrieved and a catalyst was separated by filtration in the use of sellite. The obtained filtrate was concentrated and then heated up to 80° C. upon the addition of 800 ml of a 1:2 mixture solvent of toluene and heptane, followed by allowing it to cool slowly to cause recrystallization. A crystal was filtered out and dried, thereby obtaining 315 g of 1-(1,1,1,3,3,3-hexafluoro-2-hydroxy-2-propyl)-2,4-dihydroxycyclohexane (Compound 7). The yield was 88%.

(3) Synthesis of Compound 8 (MA4-3OH): 1-(1,1,1,3,3,3-hexafluoro-2-hydroxy-2-propyl)-2-hydroxycyclohex-4-yl methacrylate

[Chemical Formula 23]

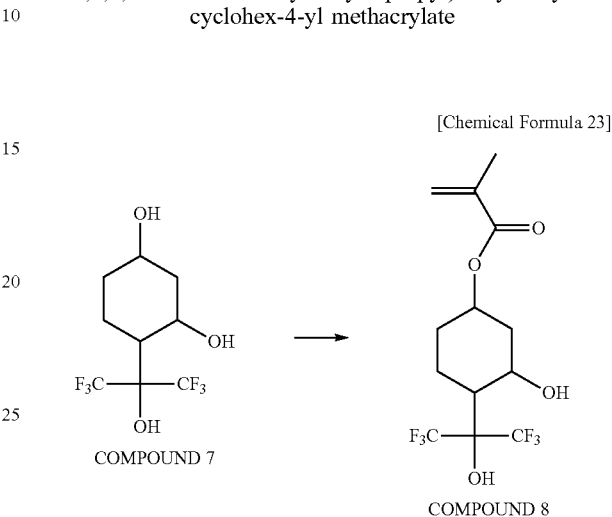

A 3,000 ml four-neck flask having a stirrer, a thermometer and a reflux condenser was charged with 270 g (0.96 mol) of Compound 7, toluene (1,200 ml), 18.4 g (0.191 mol) of methanesulfonic acid and 155 g (1.01 mol) of methacrylic anhydride, followed by stirring at 70° C. for 4 hours.

After termination of the reaction, a reaction liquid was retrieved. Upon the addition of 800 ml of diisopropyl ether, it was rinsed with a sodium hydrogencarbonate aqueous solution and saturated brine in this order. The obtained solution was concentrated and then heated up to 70° C. upon the addition of 600 ml of a 1:2 mixture solvent of toluene and heptane, followed by allowing it to cool slowly to cause recrystallization. A crystal was filtered out and dried, thereby obtaining 131 g of 1-(1,1,1,3,3,3-hexafluoro-2-hydroxy-2-propyl)-2-hydroxycyclohex-4-yl methacrylate (Compound 8; MA4-3OH). The yield was 39%.

$^{1}$H-NMR (Solvent: CDCl$_3$, Standard Substance: TMS); δ (ppm) 1.98 (3H, s), 1.65-2.29 (7H, m), 3.53 (1H, bs), 4.68 (1H, s), 5.29 (1H, s), 5.66 (1H, s), 6.07 (1H, s), 6.50 (1H, bs)

$^{19}$F-NMR (Solvent: CDCl$_3$, Standard Substance: C$_6$F$_6$); δ (ppm) 87.12 (3F, q, J=11.3 Hz), 89.70 (3F, q, J=11.3 Hz)

IR (ATR method): ν=3387, 1685, 1269, 1200, 1151, 1136, 1107, 1095, 979, 952 cm$^{-1}$ GC-MS (FI$^+$ method): m/e 350 (M$^+$)

Polymer Synthesis Example 1

Synthesis of Polymer 1

The molecular weight (the number average molecular weight Mn) and the molecular weight distribution (the ratio between Mn and the weight average molecular weight Mw, represented by Mw/Mn) was measured by HLC-8320GPC produced by TOSOH CORPORATION, in such a manner as to connect one each of an ALPHA-M column and an ALPHA-2500 column produced by TOSOH CORPORATION in series and to use tetrahydrofuran as a developing solvent. As a detector, a differential refractive index detector was adopted. Results thereof are shown in Table 1. Additionally, the composition of the polymer was determined by $^1$H-NMR and $^{19}$F-NMR, and a result thereof is shown in the "Composition (Repeating Unit)" column of Table 1. The same goes to the other polymers.

[Chemical Formula 24]

POLYMER 1

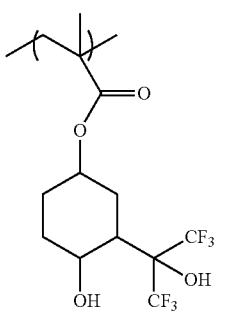

COMPOUND 4
(MA3-4OH)

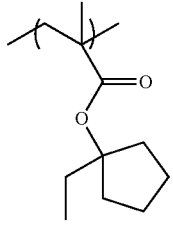

MA-ECp

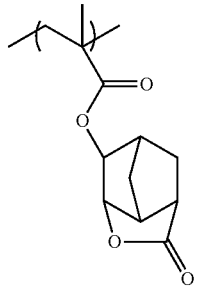

MNLA

Polymer Synthesis Example 2

Synthesis of Polymer 2

[Chemical Formula 25]

POLYMER 2

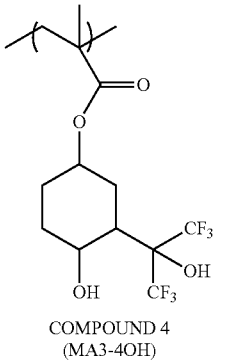

COMPOUND 4
(MA3-4OH)

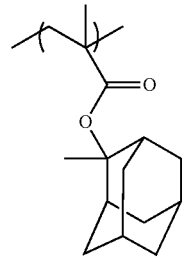

MA-MAD

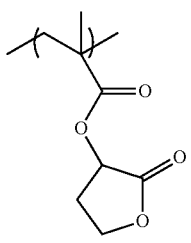

MA-GBL

In a glass flask, 17.5 g of Compound 4 (MA3-4OH), 10.9 g of 1-ethyl-1-cyclopentane methacrylate (MA-ECp), 13.0 g of 5-methacryloyloxy-2,6-norbornane carbolactone (MNLA) and 0.67 g of n-dodecyl mercaptan (produced by TOKYO CHEMICAL INDUSTRY CO., LTD.) were dissolved in 82.8 g of 2-butanone. To this solution, 1.7 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 620.0 g of n-heptane, thereby obtaining a white precipitate. The precipitate was filtered out and dried under a reduced pressure at 60° C., thereby obtaining 40.0 g of a white solid (Polymer 1).

GPC measurement result; Mn=8,500, Mw/Mn=2.1

In a glass flask, 17.5 g of Compound 4 (MA3-4OH), 13.7 g of 2-methyl-2-adamantyl methacrylate (MA-MAD), 9.9 g of γ-butyrolacton-2-yl methacrylate (MA-GBL) and 0.67 g of n-dodecyl mercaptan (produced by TOKYO CHEMICAL INDUSTRY CO., LTD.) were dissolved in 82.2 g of 2-butanone. To this solution, 1.6 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 620.0 g of n-heptane, thereby obtaining a white precipitate. The precipitate was filtered out and dried under a reduced pressure at 60° C., thereby obtaining 38.0 g of a white solid (Polymer 2).

GPC measurement result; Mn=7,800, Mw/Mn=2.1

Polymer Synthesis Example 3

Synthesis of Polymer 3

[Chemical Formula 26]

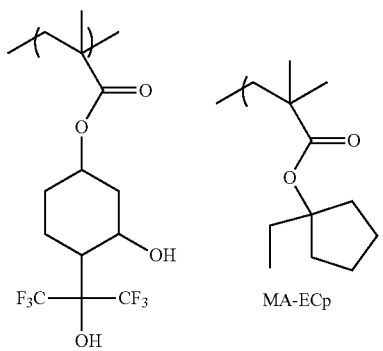

POLYMER 3

In a glass flask, 25.1 g of Compound 8 (MA4-3OH), 7.2 g of MA-ECp and 0.45 g of n-dodecyl mercaptan (produced by TOKYO CHEMICAL INDUSTRY CO., LTD.) were dissolved in 64.6 g of 2-butanone. To this solution, 1.3 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 500.0 g of n-heptane, thereby obtaining a white precipitate. The precipitate was filtered out and dried under a reduced pressure at 60° C., thereby obtaining 23.0 g of a white solid (Polymer 3).

GPC measurement result; Mn=11,200, Mw/Mn=2.2

Comparative Polymer Synthesis Example 1

Synthesis of Comparative Polymer 1

By using MA-HAD instead of Compound 4 (MA3-4OH) of Polymer Synthesis Example 1, Comparative Polymer 1 was synthesized. MA-HAD did not contain a hexafluoroisopropyl hydroxyl group.

[Chemical Formula 27]

COMPARATIVE POLYMER 1

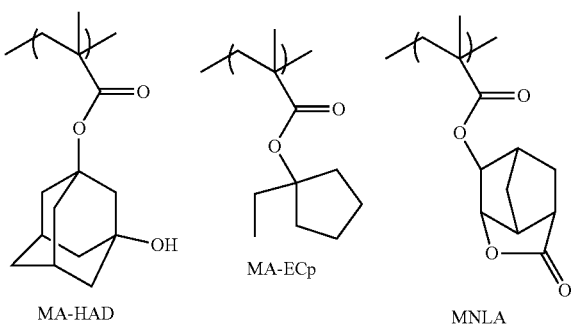

In a glass flask, 11.8 g of 3-hydroxy-1-adamantyl methacrylate (MA-HAD), 10.9 g of MA-ECp, 13.0 g of MNLA and 0.67 g of n-dodecyl mercaptan (produced by TOKYO CHEMICAL INDUSTRY CO., LTD.) were dissolved in 71.3 g of 2-butanone. To this solution, 1.4 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 620.0 g of n-heptane, thereby obtaining a white precipitate. The precipitate was filtered out and dried under a reduced pressure at 60° C., thereby obtaining 33.0 g of a white solid (Comparative Polymer 1).

GPC measurement result; Mn=8,000, Mw/Mn=2.1

Comparative Polymer Synthesis Example 2

Synthesis of Comparative Polymer 2

By using Compound 9 (MA4) instead of Compound 4 (MA3-4OH) of Polymer Synthesis Example 1, Comparative Polymer 2 was synthesized. Compound 9 had one hexafluoroisopropyl hydroxyl group bonded to a ring but a hydroxyl group was not bonded thereto.

[Chemical Formula 28]

COMPARATIVE POLYMER 2

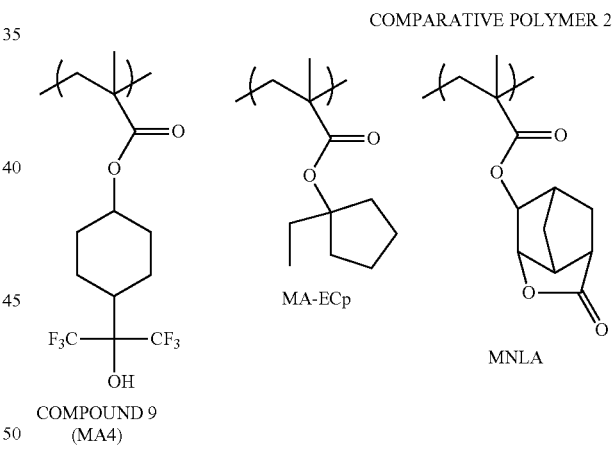

In a glass flask, 5.0 g of 1-(1,1,1,3,3,3-hexafluoro-2-hydroxy-2-propyl)cyclohex-4-yl methacrylate (Compound 9; sometimes referred to as MA-4), 3.3 g of MA-ECp, 3.9 g of MNLA and 0.20 g of n-dodecyl mercaptan (produced by TOKYO CHEMICAL INDUSTRY CO., LTD.) were dissolved in 24.4 g of 2-butanone. To this solution, 0.49 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 180.0 g of n-heptane, thereby obtaining a white precipitate.

The precipitate was filtered out and dried under a reduced pressure at 60° C., thereby obtaining 12.0 g of a white solid (Comparative Polymer 2).

GPC measurement result; Mn=10,400, Mw/Mn=2.2

Comparative Polymer Synthesis Example 3

Synthesis of Comparative Polymer 3

By using Compound 10 (MA35) instead of Compound 4 (MA3-4OH) of Polymer Synthesis Example 1, Comparative Polymer 3 was synthesized. Compound 10 had two hexafluoroisopropyl hydroxyl group bonded to a ring but a hydroxyl group was not bonded thereto.

[Chemical Formula 29]

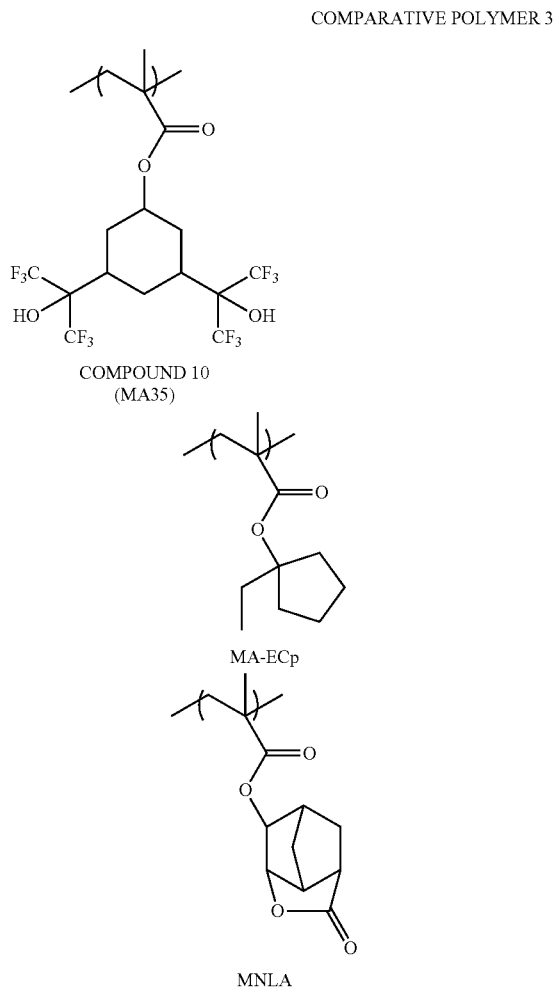

COMPARATIVE POLYMER 3

COMPOUND 10
(MA35)

MA-ECp

MNLA

In a glass flask, 25.0 g of 1,3-bis(1,1,1,3,3,3-hexafluoro-2-hydroxy-2-propyl)cyclohex-4-yl methacrylate (Compound 10; MA35), 10.9 g of MA-ECp, 13.0 g of MNLA and 0.67 g of n-dodecyl mercaptan (produced by TOKYO CHEMICAL INDUSTRY CO., LTD.) were dissolved in 97.7 g of 2-butanone (solvent). To this solution, 2.0 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 620.0 g of n-heptane, thereby obtaining a white precipitate.

The precipitate was filtered out and dried under a reduced pressure at 60° C., thereby obtaining 44.0 g of a white solid (Comparative Polymer 3).

GPC measurement result; Mn=9,300, Mw/Mn=1.8

Reference Polymer Synthesis Example 1

Synthesis of Reference Polymer 1: Synthesis of General-Purpose Resist Polymer

As a general-purpose resist polymer, Reference Polymer 1 was synthesized from the following monomers.

[Chemical Formula 30]

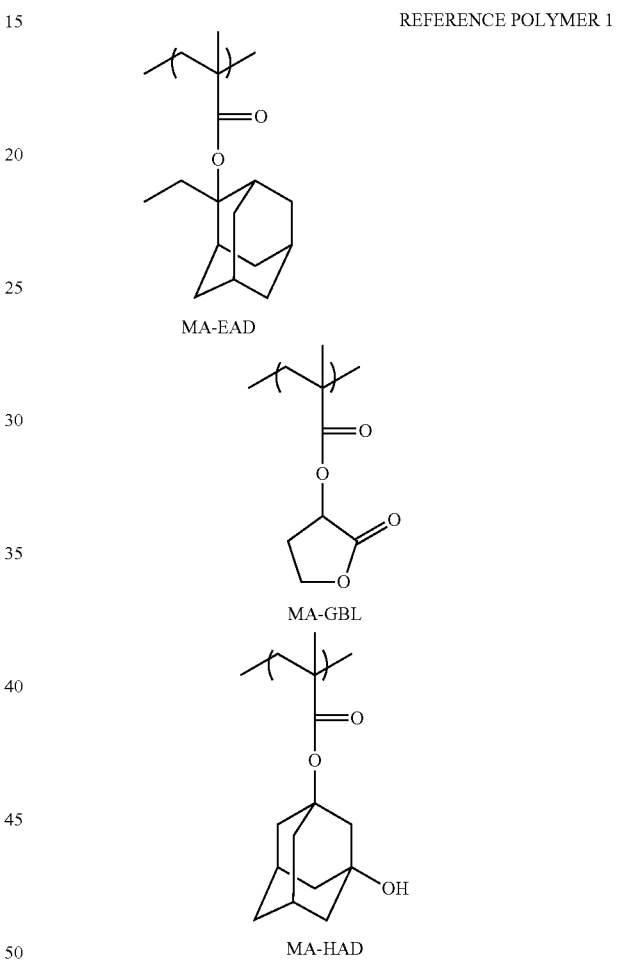

REFERENCE POLYMER 1

MA-EAD

MA-GBL

MA-HAD

In a glass flask, 10.8 g of 2-ethyl-2-adamantyl methacrylate (MA-EAD) serving as a monomer, 10.1 g of MA-GBL, 12.0 g of MA-HAD and 0.54 g of n-dodecyl mercaptan (produced by TOKYO CHEMICAL INDUSTRY CO., LTD.) serving as a chain transfer agent were dissolved in 65.8 g of 2-butanone as a solvent. To this solution, 1.35 g of AIBN (2,2'-azobis(isobutyronitrile) produced by Wako Pure Chemical Industries, Ltd.) was added as a polymerization initiator, upon which degassing was carried out with stirring. Then, nitrogen gas was introduced thereinto, followed by conducting a 16 hours of reaction at 75° C. A solution obtained after the reaction terminated was added dropwise to 500.0 g of n-heptane, thereby obtaining a white precipitate. The precipitate was filtered out and dried under a reduced pressure at 60° C., thereby obtaining 29.6 g of a white solid (a polymer for use in resist) (the yield was 90%).

GPC measurement result; Mn=11,500, Mw/Mn=2.1

TABLE 1

| No. | Polymer | Composition (Repeating Unit) (mol %) | | | Molecular weight Mw | Mw/Mn | Yield (%) |
|---|---|---|---|---|---|---|---|
| Polymer Synthesis Example 1 | Polymer 1 | Compound 4 32 | MA-ECp 33 | MNLA 35 | 8,500 | 2.1 | 95 |
| Polymer Synthesis Example 2 | Polymer 2 | Compound 4 29 | MA-MAD 35 | MA-GBL 36 | 7,800 | 2.1 | 94 |
| Polymer Synthesis Example 3 | Polymer 3 | Compound 8 63 | MA-ECp 37 | — | 11,200 | 2.2 | 71 |
| Comparative Polymer Synthesis Example 1 | Comparative Polymer 1 | MA-HAD 27 | MA-ECp 37 | MNLA 36 | 8,000 | 2.1 | 94 |
| Comparative Polymer Synthesis Example 2 | Comparative Polymer 2 | Compound 9 30 | MA-ECp 35 | MNLA 35 | 10,400 | 2.2 | 94 |
| Comparative Polymer Synthesis Example 3 | Comparative Polymer 3 | Compound 10 33 | MA-ECp 33 | MNLA 34 | 9,300 | 1.8 | 90 |
| Reference Polymer Synthesis Example 1 | Reference Polymer 1 | MA-EAD 35 | MA-GBL 35 | MA-HAD 30 | 11,500 | 2.1 | 90 |

Hereinafter, evaluations as a resist material will be discussed.

Examples 1 to 4, Comparative Examples 1 to 3, Reference Example 1

Preparation of Resist

Polymers synthesized by Polymer Synthesis Examples 1 to 3, Comparative Polymer Synthesis Examples 1 to 3 and Reference Polymer Synthesis Example were prepared. To each of the polymers, a photoacid generator, a basic compound and a solvent were mixed at ratios as shown in Table 2, thereby preparing resist solutions (Resists 1 to 4, Comparative Resists 1 to 3, Reference Resist 1).

Each of the prepared resist solutions was filtered through a 0.2 μm membrane filter and then applied onto a surface-treated silicon wafer calcined at 200° C. for 60 seconds upon application of a solution for use in antireflective films (ARC29A, 78 nm, produced by Nissan Chemical Industries, Ltd.), with a spinner, at a rotation speed of 1,500 rpm. Then, the wafer was dried on a hot plate of 100° C. for 90 seconds, thereby forming a resist film.

Measurement of Contact Angle

A contact angle of waterdrop to each resist film formed on the obtained silicon wafers was measured by using a contact angle meter (produced by Kyowa Interface Science Co., Ltd.). Results thereof are shown in Table 2.

The resist films obtained from Resists 1 to 4, Comparative Resist 2 and Comparative Resist 3, into which fluoropolymers were mixed, were confirmed to have higher contact angles than the resist film obtained from Comparative Resist 1. The polymers had a hexafluoroisopropyl hydroxyl group, except for the polymer contained in Comparative Resist 1. An improvement of water repellency achieved by incorporating the fluoropolymer prevents the resist from immersion in water while retarding the occurrence of a watermark defect, in a lithography using an immersion exposure device.

TABLE 2

| No. | Resist | Polymer (part by weight) | Photoacid Generator (part by weight) | Basic Substance (part by weight) | Solvent (part by weight) | Contact Angle (°) |
|---|---|---|---|---|---|---|
| Example 1 | Resist 1 | Polymer 1 (100) | PAG 1 (5) | Base 1 (1) | PGMEA (900) | 73 |
| Example 2 | Resist 2 | Polymer 2 (100) | PAG 1 (5) | Base 1 (1) | PGMEA (900) | 72 |
| Example 3 | Resist 3 | Polymer 3 (100) | PAG 1 (5) | Base 1 (1) | PGMEA (900) | 80 |
| Example 4 | Resist 4 | Polymer 3 (100) | PAG 2 (5) | Base 2 (1) | MIBC (900) | 79 |
| Comparative Example 1 | Comparative Resist 1 | Comparative Polymer 1 (100) | PAG 1 (5) | Base 1 (1) | PGMEA (900) | 65 |
| Comparative Example 2 | Comparative Resist 2 | Comparative Polymer 2 (100) | PAG 1 (5) | Base 1 (1) | PGMEA (900) | 81 |
| Comparative Example 3 | Comparative Resist 3 | Comparative Polymer 3 (100) | PAG 2 (5) | Base 2 (1) | MIBC (900) | 77 |
| Reference Example 1 | Reference Resist 1 | Reference Polymer 1 (100) | PAG 1 (5) | Base 1 (1) | PGMEA (900) | 65 |

PAG 1: Triphenylsulfonium nonafluorobutanesulfonate
PAG 2: Triphenylsulfonium trifluoromethanesulfonate
Base 1: Isopropanolamine
Base 2: Triethenolamine
PGMEA: Propylene glycol monomethyl ether acetate
MIBC: 4-Methyl-2-pentanol Examples 5 to 8, Comparative Examples 4 to 6, Reference Example 2

Examination of Solubility in Developing Solution

A silicon wafer to which each of the resists was applied in the same manner as discussed above so as to form a resist film was immersed in an alkali developing solution (2.38 wt % tetramethylammonium hydroxide aqueous solution) at room temperature for 60 seconds, upon which solubility was examined. Solubility of resin was decided by measuring a remainder of the film after immersion by a film thickness meter applying interference of light. Results thereof are shown in Table 3. The case where the film disappeared completely was referred to as "soluble", the case where a part of the film remained was referred to as "partially remained", and the case of making scarcely any changes was referred to as "insoluble".

In the cases of Examples 5 to 8 employing Resists 1 to 4, a pattern having a rectangular shape was formed and exhibited an excellent resolution performance. On the other hand, Comparative Example 4 employing Comparative Resist 1 caused adhesion between lines, which was considered brought about by swelling, so that a pattern was disturbed in shape. Comparative Example 5 employing Comparative Resist 2 provided a pattern having an outstretched-head shape and a residue, the pattern being considered inferior in solubility. In Comparative Example 6 employing Comparative Resist 3, there were observed a film-thinning of an unexposed portion considered derived from an excessive resolution performance, and a pattern of a rounded-head shape.

Additionally, Reference Example 2 using Reference Resist 1 prepared from a non-fluorine general-purpose resist formed a pattern not good in shape, i.e., the head of the pattern is remarkably outstretched.

TABLE 3

| No. | Resist | Solubility in Alkali Developing Solution | | Solubility in Solvent | Resolution Performance |
| --- | --- | --- | --- | --- | --- |
| | | Before | After Exposure | (MIBC) | |
| Example 5 | Resist 1 | C | A | B | Rectangularly shaped pattern |
| Example 6 | Resist 2 | C | A | B | Rectangularly shaped pattern |
| Example 7 | Resist 3 | C | A | A | Rectangularly shaped pattern |
| Example 8 | Resist 4 | C | A | A | Rectangularly shaped pattern |
| Comparative Example 4 | Comparative Resist 1 | C | A | C | Pattern disturbed in shape due to adhesion between lines |
| Comparative Example 5 | Comparative Resist 2 | C | A | C | Pattern having outstretched-head shape and residue |
| Comparative Example 6 | Comparative Resist 3 | C | A | A | Pattern high in film—thinning and having rounded-head shape |
| Reference Example 2 | Reference Resist 1 | C | A | C | Pattern having remarkably outstretched head so as not to be good in shape |

Solubility: A; Soluble, B; Patially Remained:, C; Insoluble
MIBC: 4-Methyl-2-pentanol Any of Resists 1 to 4 and Comparative Resists 1 to 3 was insoluble in the alkali developing solution in the unexposed state and became soluble after exposure. With this, it was confirmed that all of the examined resists had a dissolution contrast required for a photosensitive resin.

Examination of Exposure Resolution

A silicon wafer to which each of the resists was applied in the same manner as discussed above so as to form a resist film was exposed to 193 nm through a photomask, after being subjected to a prebake at 100° C. for 60 seconds. Pure water was added dropwise for 2 minutes to the wafer that underwent exposure, while rotating the wafer. Thereafter, a post exposure bake was performed at 120° C. for 60 seconds, thereby conducting development with an alkali developing solution.

The obtained pattern was observed by a scanning electron microscope (SEM), followed by carrying out an evaluation of the resolution performance. Results thereof are shown in Table 3.

Examination of Solubility of Solvent in 4-Methyl-2-Pentanol (MIBC)

A silicon wafer to which each of the above-mentioned resists was applied so as to form a resist film thereon was immersed in 4-methyl-2-pentanol (MIBC) at room temperature for 60 seconds. As a result of examining its solubility, Resists 1 to 4 and Comparative Resist 3 exhibited solubility. In Resists 3 and 4 and Comparative Resist 3 in particular, which were high in fluorine content, a remarkable solubility was observed. Results thereof are shown in Table 3. The case where the film disappeared completely was referred to as "soluble", the case where a part of the film remained was referred to as "partially remained", and the case of making scarcely any changes was referred to as "insoluble".

On the other hand, as a result of conducting the examination of solubility in 4-methyl-2-pentanol (MIBC), a resist film (Reference Resist 1) formed of a general-purpose resist composition as shown by Reference Example 1 (MA-EAD/MA-GBL base) was confirmed to be insoluble.

With these experimental results, it was suggested that, in such a case as to use the above-mentioned general-purpose resist composition for the first resist film in the double patterning where the exposure treatment was performed on the second resist film applied to the first resist film after forming a pattern on the first resist film, a resist material prepared by dissolving the fluoropolymer used in Resists 1 to 4 and Comparative Resist 3 in MIBC can be used as a resist material for forming the second resist film.

In other words, the solvent (which was MIBC in this case) used for the second resist material does not affect the resist pattern formed on the first resist film, with which it becomes possible to form the second resist film with no influence upon the first resist pattern.

INDUSTRIAL APPLICABILITY

The resist material using the fluoropolymer of the present invention makes it possible to form a resoluble pattern excellent in terms of the depth of focus, the mask error factor and the line edge roughness not only in dry exposure but also in immersion exposure. Additionally, the resist material of the present invention is useful as a top resist for use in a double patterning process. Furthermore, it is possible to produce these fluoropolymers from the polymerizable fluoromonomer of the present invention.

The invention claimed is:
1. A resist material, comprising:
  a fluoropolymer, wherein the fluoropolymer comprises:
    a repeating unit represented by the following general formula (5):

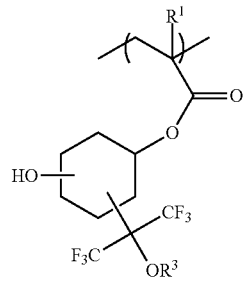

(5)

where
R$^1$ represents a hydrogen atom, methyl group, fluorine atom, or trifluoromethyl group, and
a hydroxyl group represented by —OH and directly bonded to a ring, and a hexafluoroisopropyl hydroxyl group represented by —C(CF$_3$)$_2$OH are adjacent to each other.

2. A resist material as claimed in claim 1, further containing:
  at least one selected from the group consisting of an acid generator, a basic compound and an organic solvent.

3. A resist material as claimed in claim 2, wherein the organic solvent is an alcohol-based solvent having 5 to 20 carbon atoms.

* * * * *